US012598882B2

(12) United States Patent
Lee et al.

(10) Patent No.: US 12,598,882 B2
(45) Date of Patent: Apr. 7, 2026

(54) LIGHT EMITTING DISPLAY APPARATUS

(71) Applicant: LG Display Co., Ltd., Seoul (KR)

(72) Inventors: SeonWoo Lee, Paju-si (KR); Seol Heo, Paju-si (KR); Taehyun Kim, Paju-si (KR); Sanghyo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 412 days.

(21) Appl. No.: 18/371,816

(22) Filed: Sep. 22, 2023

(65) Prior Publication Data

US 2024/0206254 A1 Jun. 20, 2024

(30) Foreign Application Priority Data

Dec. 14, 2022 (KR) ........................ 10-2022-0174758

(51) Int. Cl.
| | |
|---|---|
| *H10K 59/131* | (2023.01) |
| *H10K 59/121* | (2023.01) |
| *H10K 59/123* | (2023.01) |
| *H10K 59/124* | (2023.01) |
| *H10K 59/35* | (2023.01) |
| *H10K 59/80* | (2023.01) |

(52) U.S. Cl.
CPC ......... *H10K 59/131* (2023.02); *H10K 59/121* (2023.02); *H10K 59/123* (2023.02); *H10K 59/124* (2023.02); *H10K 59/35* (2023.02); *H10K 59/875* (2023.02)

(58) Field of Classification Search
CPC .. H10K 59/131; H10K 59/121; H10K 59/123; H10K 59/124; H10K 59/35; H10K 59/875; H10K 59/12; H10K 59/351; H10K 50/813; H10K 50/818; H10K 50/856
See application file for complete search history.

(56) References Cited

U.S. PATENT DOCUMENTS

| | | | | |
|---|---|---|---|---|
| 2017/0294155 A1* | 10/2017 | Kim | ...................... | G09G 3/2074 |
| 2023/0217710 A1* | 7/2023 | Jinta | .................... | H10K 59/351 |
| | | | | 257/40 |
| 2024/0188328 A1* | 6/2024 | Zhang | ...................... | G09G 3/32 |
| 2025/0098449 A1* | 3/2025 | Yuan | .................... | H10K 59/122 |

FOREIGN PATENT DOCUMENTS

| | | |
|---|---|---|
| KR | 10-2020-0029226 A | 3/2020 |
| KR | 10-2020-0079740 A | 7/2020 |
| KR | 10-2021-0083944 A | 7/2021 |

* cited by examiner

*Primary Examiner* — Karen Kusumakar

(74) *Attorney, Agent, or Firm* — Birch, Stewart, Kolasch & Birch, LLP

(57) ABSTRACT

A light emitting display apparatus can include a first anode electrode in a first pixel; a second anode electrode in a second pixel; a driving transistor to power the first pixel; a first connection electrode electrically connected to the driving transistor; and a second connection electrode on a different layer than the first connection electrode and electrically connected to the driving transistor. Also, an organic insulating layer is disposed over the first and second connection electrodes and includes a first driving contact hole overlapping a portion of the first connection electrode and a first welding contact hole overlapping a portion of the second connection electrode, in which the first anode electrode overlaps with the first driving contact hole, and the second anode electrode overlaps the first welding contact hole, and the first driving contact hole and the first welding contact hole are disposed on a line.

30 Claims, 9 Drawing Sheets

LIGHT EMITTING DISPLAY APPARATUS

CROSS-REFERENCE TO RELATED APPLICATION

This application claims priority to Korean Patent Application No. 10-2022-0174758 filed in the Republic of Korea on Dec. 14, 2022, the entirety of which is hereby expressly incorporated by reference into the present application.

BACKGROUND

Field of the Invention

The present disclosure relates to a light emitting display apparatus.

Description of the Related Art

Since a light emitting display apparatus has a high response speed, low power consumption, and self-emits light without requiring a separate light source unlike a liquid crystal display apparatus, there is no problem in a viewing angle and thus the light emitting display apparatus has received attention as a next-generation flat panel display apparatus.

The light emitting display apparatus displays an image through light emission of a light emitting element that includes a light emitting layer interposed between two electrodes.

However, light extraction efficiency of the light emitting display apparatus is reduced as some of the light emitted from the light emitting element is not emitted to the outside due to total reflection on the interface between a light emitting element layer and an electrode and/or between a substrate and an air layer. Therefore, the light emitting display apparatus has some problems in that luminance is reduced and power consumption is increased due to low light extraction efficiency.

Also, issues can occur during the manufacture of large, high definition displays, which can result in the occurrence of dead subpixels. Thus, there is a need for being able to repair or avoid the occurrence of a dead subpixel without unduly decreasing the aperture or taking up too much space.

SUMMARY OF THE DISCLOSURE

The present disclosure has been made in view of the above limitations and it is an object of the present disclosure to provide a light emitting display apparatus that can improve light extraction efficiency of light emitted from a light emitting element.

It is another object of the present disclosure to provide a light emitting display apparatus that can improve an aperture ratio.

It is other object of the present disclosure to provide a light emitting display apparatus that can prevent metal patterns provided in a pixel circuit from being damaged due to holes provided in a circuit area.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display apparatus including a first anode electrode provided in a first pixel, a second anode electrode provided in a second pixel disposed adjacent to the first pixel, a driving transistor supplying a power source to the first pixel, a first connection electrode electrically connected to the driving transistor, a second connection electrode provided on a layer different from the first connection electrode and electrically connected to the driving transistor, and an organic insulating layer disposed on the first connection electrode and the second connection electrode, including a first driving contact hole overlapped with at least a portion of the first connection electrode and a first welding contact hole overlapped with at least a portion of the second connection electrode. The first anode electrode overlaps the first driving contact hole, and the second anode electrode overlaps the first welding contact hole. The first driving contact hole and the first welding contact hole are disposed adjacent to each other on a first line.

In accordance with another aspect of the present disclosure, the above and other objects can be accomplished by the provision of a light emitting display apparatus comprising a substrate provided with a subpixel including a light emission area and a circuit area, a light emitting element provided in the light emission area on the substrate, including an anode electrode, a light emitting layer and a cathode electrode, a driving transistor provided in the circuit area on the substrate, a driving contact portion provided in the circuit area, electrically connecting the anode electrode of the light emitting element with the driving transistor, and a welding contact portion provided in the circuit area, electrically connecting an anode electrode of a light emitting element provided in an adjacent subpixel disposed adjacent to the subpixel with the driving transistor. The driving contact portion and the welding contact portion are disposed adjacent to each other in a first direction.

BRIEF DESCRIPTION OF THE DRAWINGS

The above and other objects, features and other advantages of the present disclosure will be more clearly understood from the following detailed description taken in conjunction with the accompanying drawings, in which.

3

Figure 5:
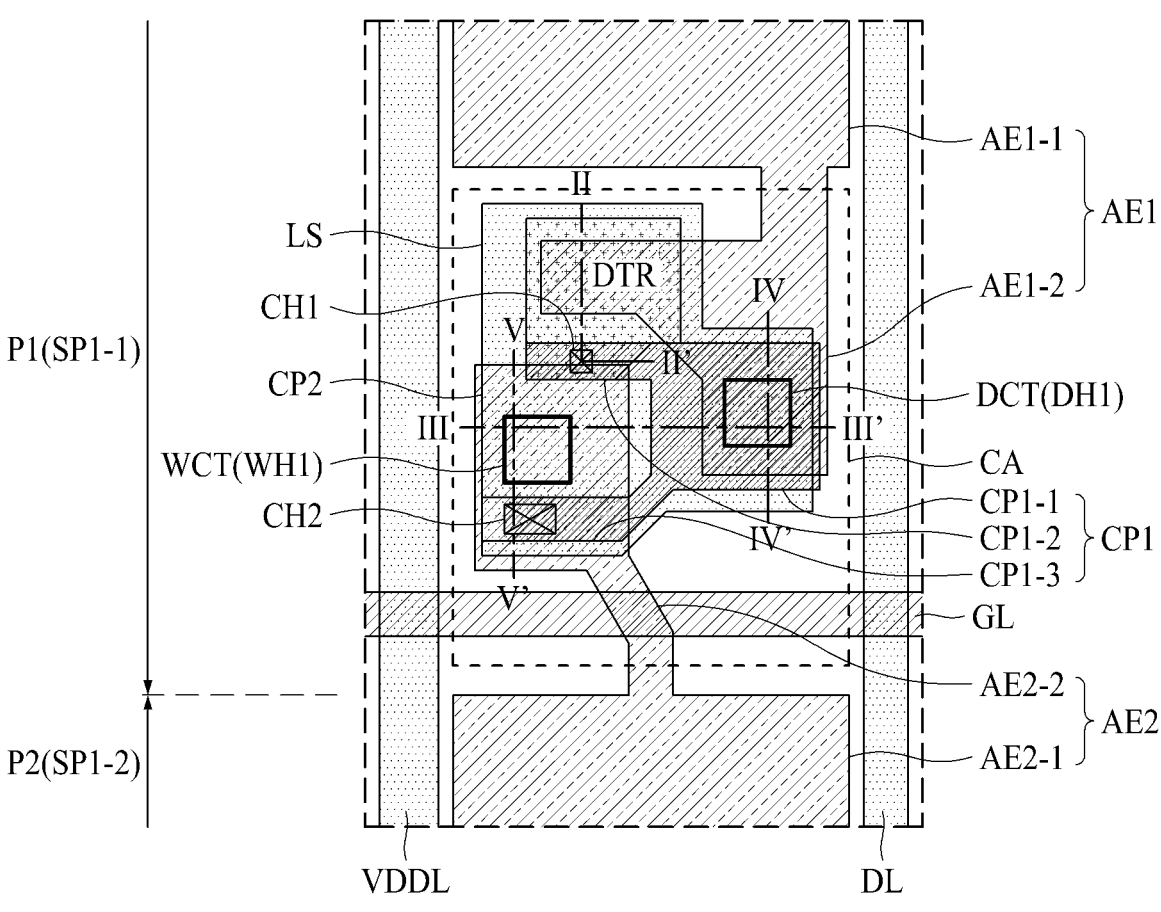
FIG. 5 is a plan view illustrating a driving transistor and contact portions, which are provided in the circuit area of FIG. 2 according to an embodiment of the present disclosure.
Figure 8:
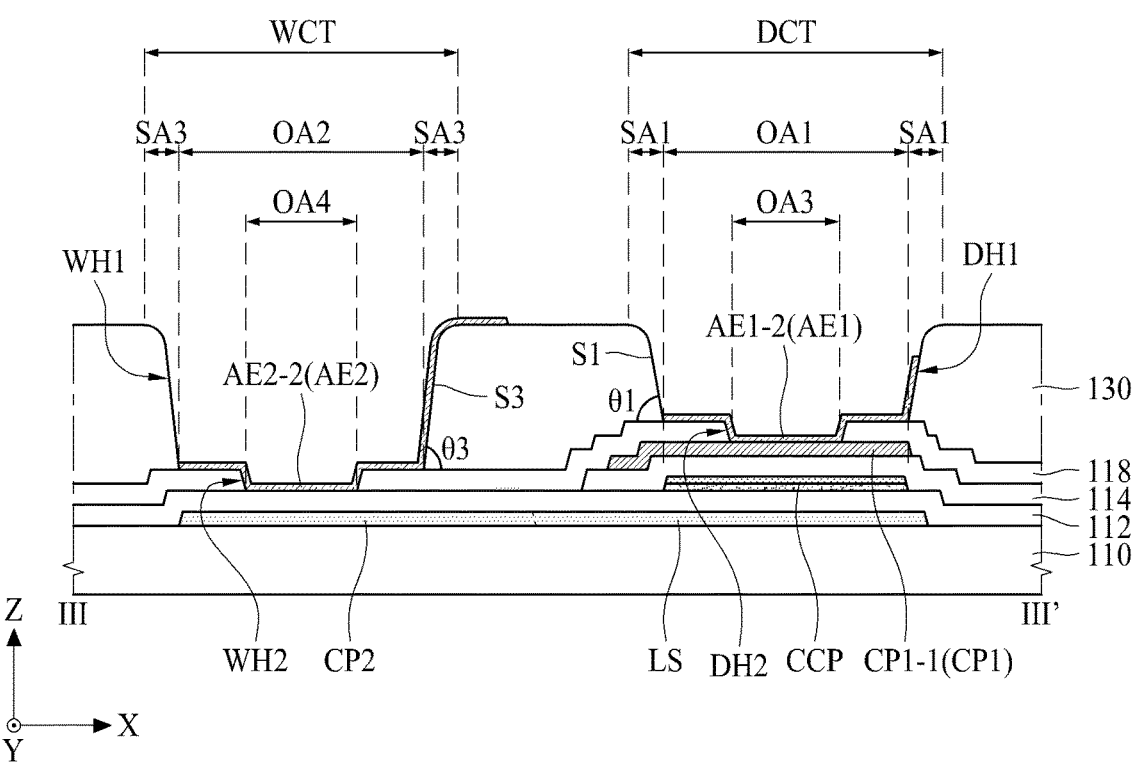
Figure 9:
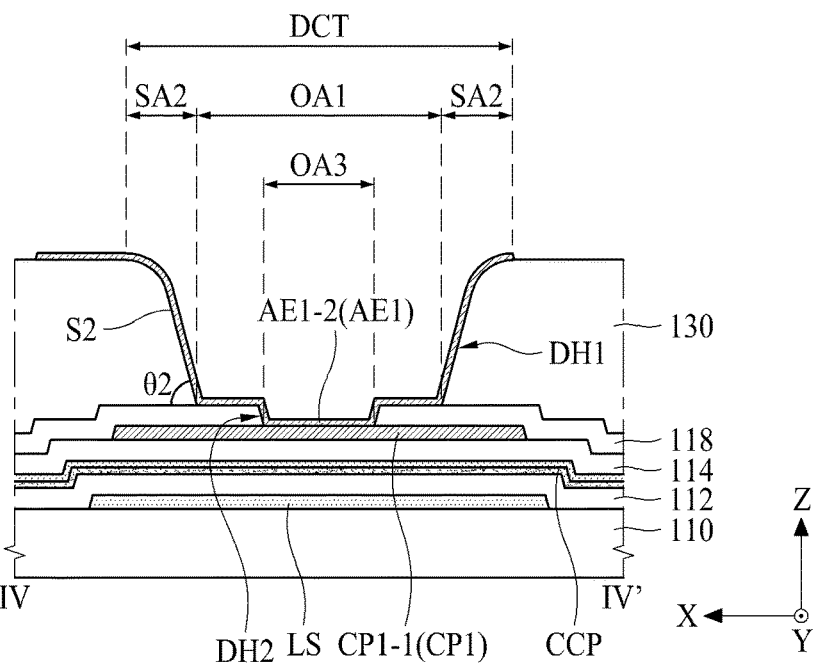
Figure 10:
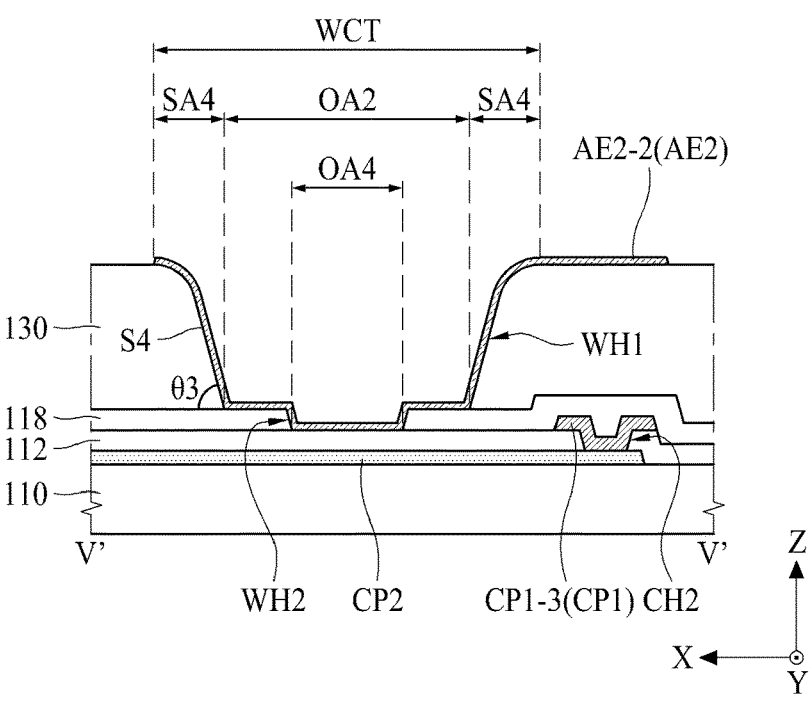
Figure 11:
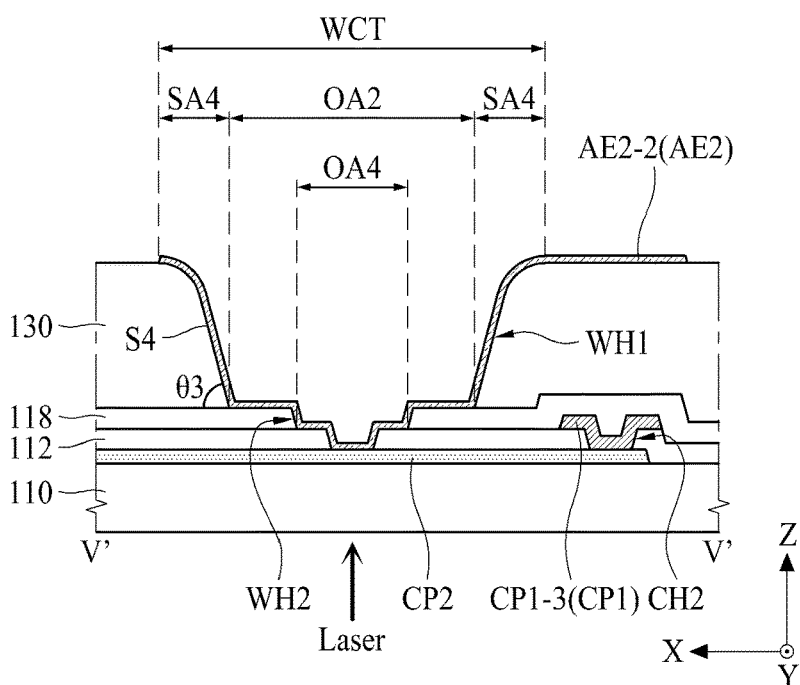
Figure 12A:
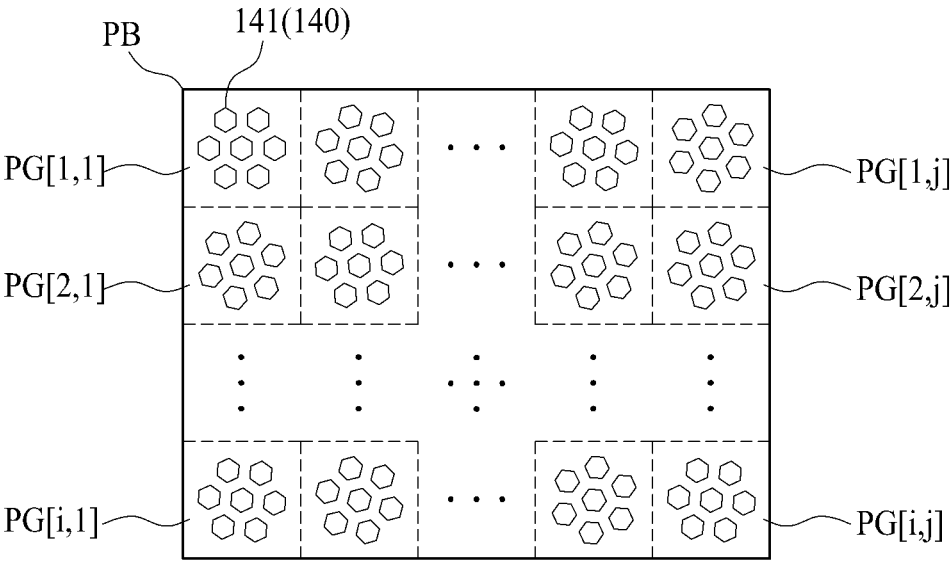
Figure 12B:
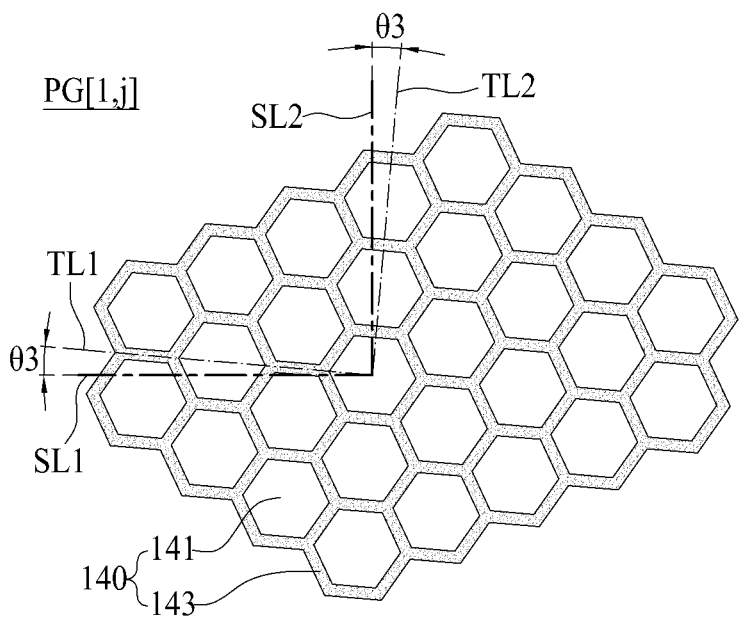
Figure 12C:
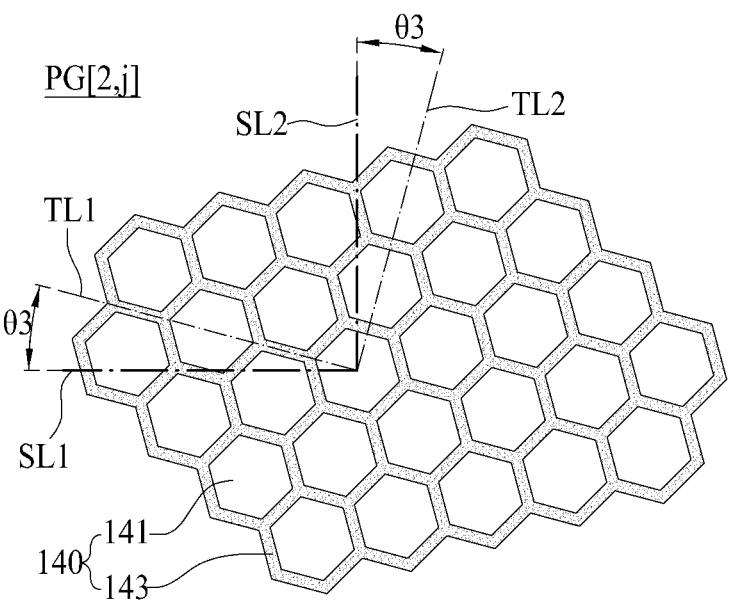

FIG. 8 is a cross-sectional view illustrating III-III' shown in the driving contact portion and the welding contact portion of FIG. 5 according to an embodiment of the present disclosure;

FIG. 9 is a cross-sectional view illustrating IV-IV' shown in the driving contact portion of FIG. 5 according to an embodiment of the present disclosure;

FIG. 10 is a cross-sectional view illustrating V-V' shown in the welding contact portion of FIG. 5 according to an embodiment of the present disclosure;

FIG. 11 is a cross-sectional view illustrating an example in which laser is irradiated to the welding contact portion of FIG. 5 according to an embodiment of the present disclosure;

FIG. 12A is a view illustrating a rotational structure of a light extraction unit per pixel according to an embodiment of the present disclosure;

FIG. 12B is an enlarged view illustrating a light extraction unit configured in a pixel of a first row and a (j)th column, which is shown in FIG. 12A, according to an embodiment of the present disclosure; and FIG. 12C is an enlarged view illustrating a light extraction unit configured in a pixel of an (i)th row and a (j)th column, which is shown in FIG. 12A, according to an embodiment of the present disclosure.

DETAILED DESCRIPTION OF THE EMBODIMENTS

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, dimensions (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a situation where "comprise," "have," and "include" described in the present specification are used, another part can be added unless "only" is used. The terms of a singular form can include plural forms unless referred to the contrary.

In construing an element, the element is construed as including an error range although there is no explicit description.

In describing a position relationship, for example, when the position relationship is described as "upon~," "above~," "below," and "next to~," one or more portions can be arranged between two other portions unless 'just' or 'direct' is used.

It will be understood that, although the terms "first," "second," etc., can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., can be used. These terms are intended to identify the corresponding elements from the other elements, and basis, order, or number of the corresponding elements are not limited by these terms. The expression that an element is "connected" or "coupled" to another element should be understood that the element can directly be connected or coupled to another element but can directly be connected or coupled to another element unless specially mentioned, or a third element can be interposed between the corresponding elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Figure 1:
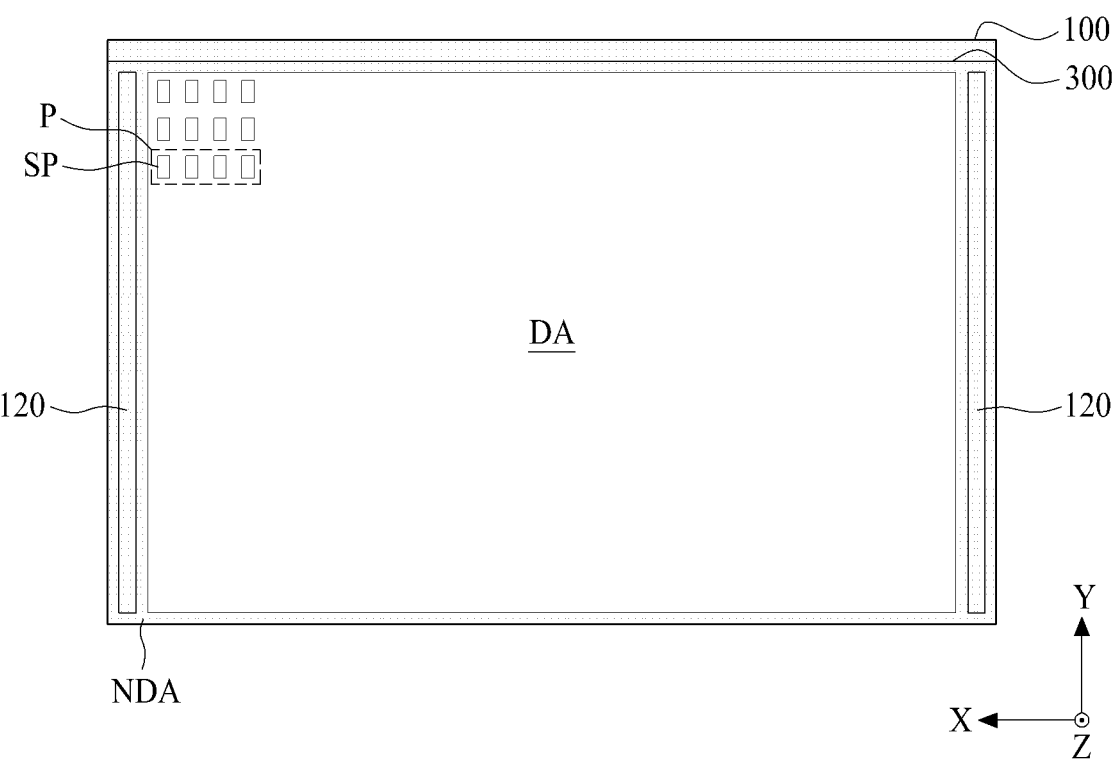
FIG. 1 is a schematic plan view illustrating a light emitting display apparatus according to one embodiment of the present disclosure.

FIG. 1 is a schematic plan view illustrating a light emitting display apparatus according to one embodiment of the present disclosure.

Referring to FIG. 1, the light emitting display apparatus according to one embodiment of the present disclosure includes a first substrate 100, a plurality of pixels P and a second substrate 300.

The first substrate 100 is a thin film transistor array substrate, and can include glass or a plastic material. The first substrate 100 can be categorized into a display area DA and a non-display area NDA.

The display area DA is an area in which a plurality of pixels P are provided to display an image, and can correspond to the other area except for an edge area of the first substrate 100.

A plurality of pixels P can be provided in the display area DA, and can be defined as a unit area in which light is actually emitted. Each of the plurality of pixels P can include a plurality of subpixels SP. For example, each of the plurality of pixels P can include a red subpixel that emits red light, a green subpixel that emits green light, and a blue subpixel that emits blue light, but is not necessarily limited thereto. For another example, each of the plurality of pixels P can include a white subpixel that emits white light. Sizes of the plurality of subpixels included in each of the plurality of pixels P can be the same as or different from each other.

The non-display area NDA is an area in which an image is not displayed, and can correspond to an area excluding the display area DA. The non-display area NDA is an edge area of the first substrate 100 surrounding the display area DA, can have a relatively very narrow width, and can be defined as a bezel area. The non-display area NDA can be provided with a peripheral circuit 120 that includes a line and a circuit to drive the plurality of pixels P provided in the display area DA.

The peripheral circuit 120 can include a gate driving circuit connected to the plurality of pixels P. The gate driving circuit can be integrated in the non-display area NDA at one side or both sides of the first substrate 100 and connected to the plurality of pixels P in accordance with a manufacturing process of a thin film transistor. The gate driving circuit can be formed by a gate driver in panel (GIP) method, a gate driver in active area (GIA) method or a tape automated bonding (TAB) method.

The second substrate 300 can protect a pixel array provided on the first substrate 100. The second substrate 300 can be defined as an opposing substrate, an encapsulation substrate or a color filter array substrate, and can be bonded to the first substrate 100 through an adhesive member (or a transparent adhesive). The second substrate 300 can include a transparent glass material or a transparent plastic material, but is not limited thereto. The second substrate 300 can be omitted if necessary.

Figure 2:
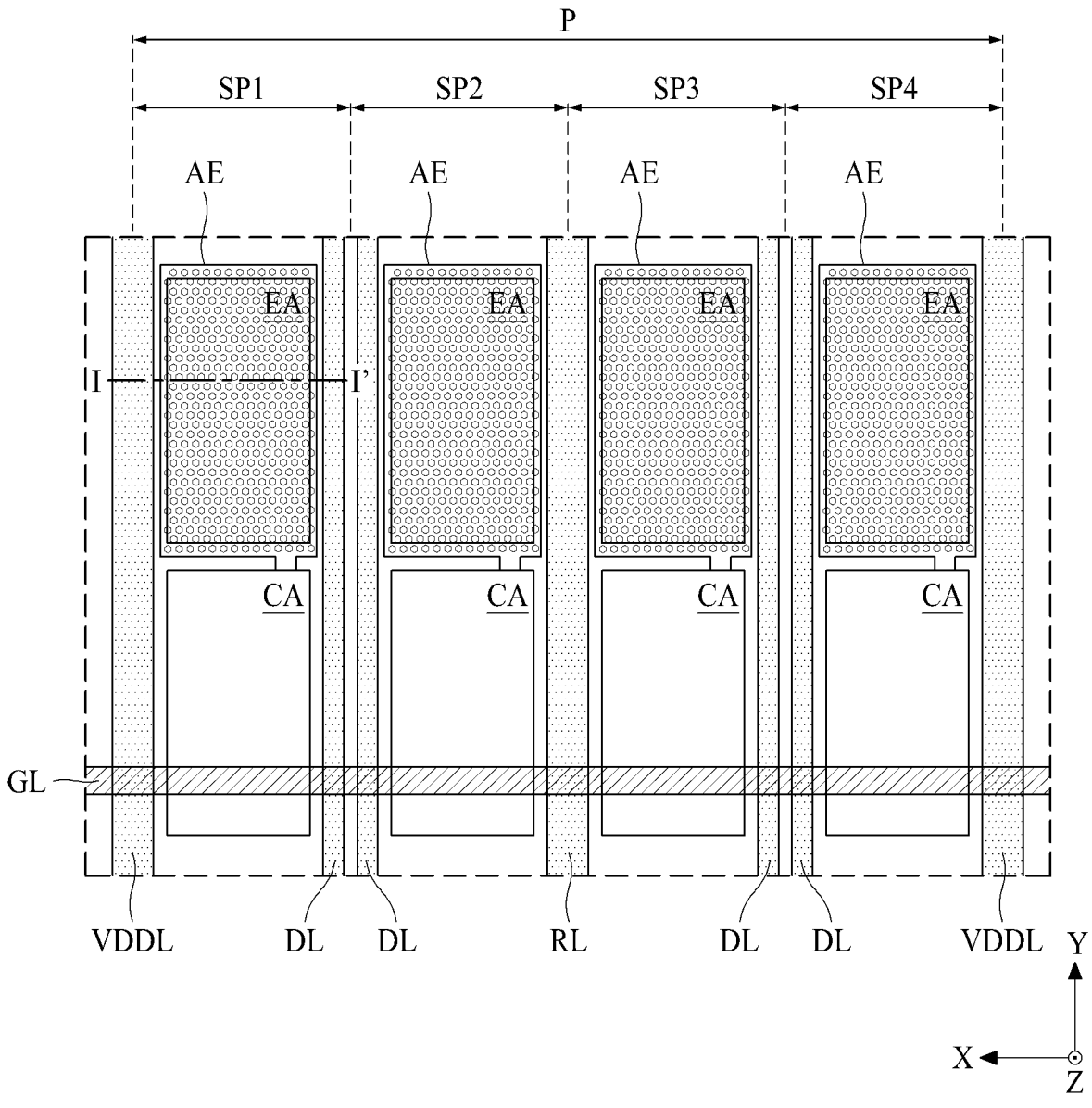
FIG. 2 is a schematic plan view illustrating a pixel provided in a display area according to an embodiment of the present disclosure.
Figure 3:
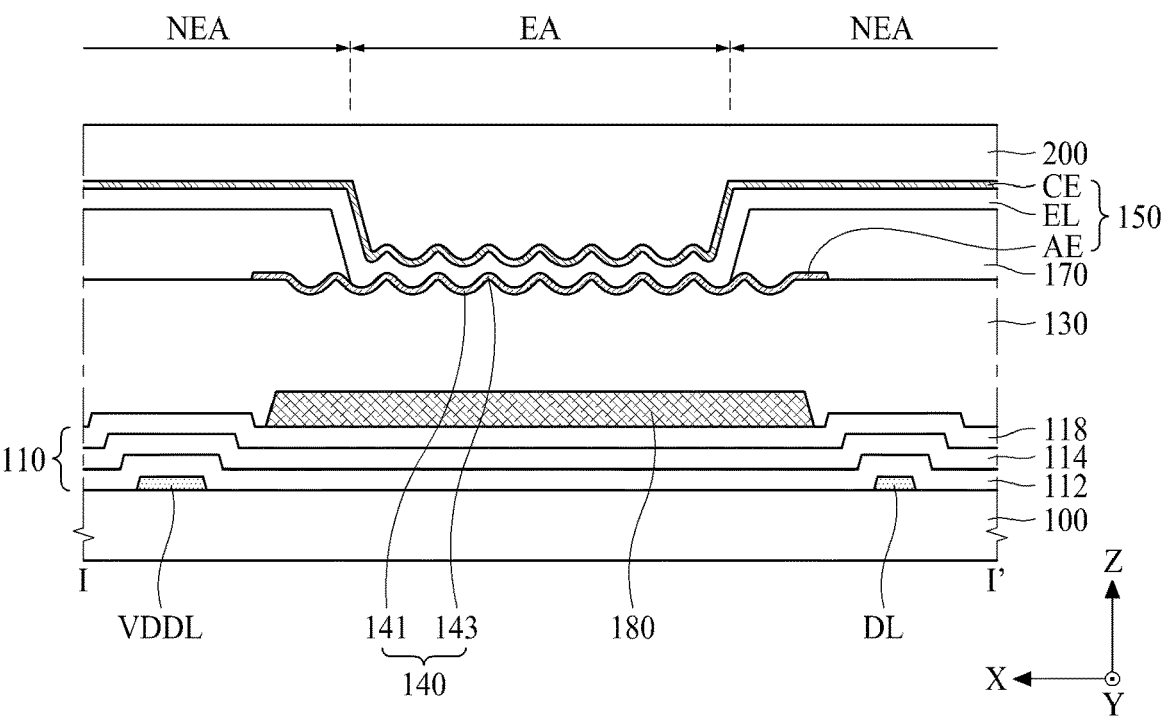
FIG. 3 is a cross-sectional view illustrating I-I' shown in a light emission area of FIG. 2 according to an embodiment of the present disclosure.
Figure 4:
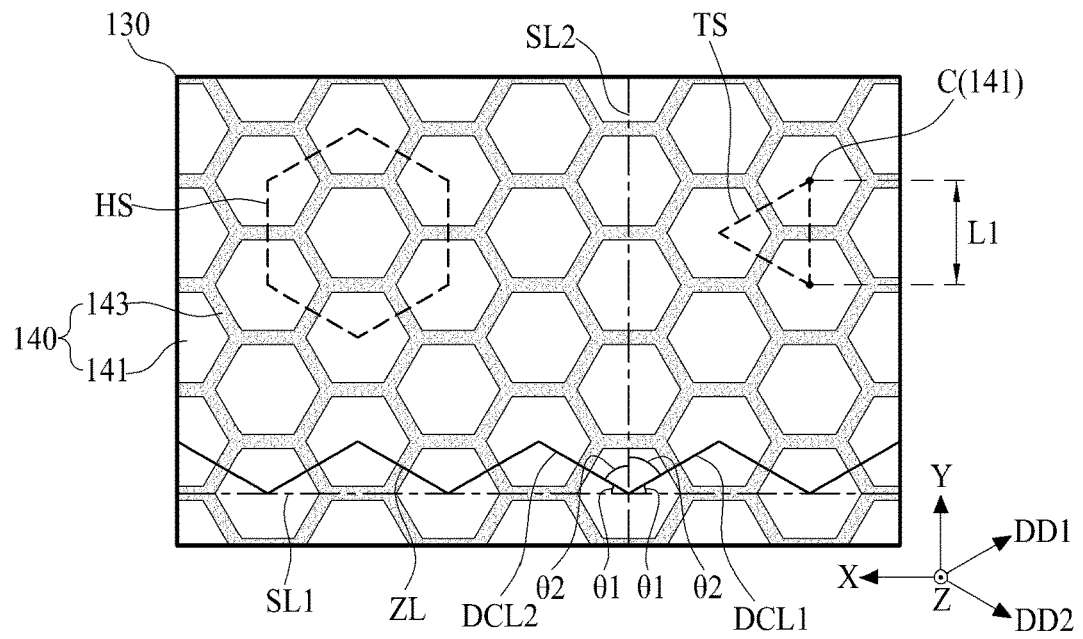
FIG. 4 is a plan view illustrating a portion of a light extraction unit shown in FIG. 3 according to an embodiment of the present disclosure.

FIG. 2 is a schematic plan view illustrating a pixel provided in a display area according to an embodiment of the present disclosure, FIG. 3 is a cross-sectional view illustrating I-I' shown in a light emission area of FIG. 2 according to an embodiment of the present disclosure, and FIG. 4 is a plan view illustrating a portion of a light extraction unit shown in FIG. 3 according to an embodiment of the present disclosure.

Referring to FIGS. 1 and 2, the light emitting display apparatus according to one embodiment of the present disclosure includes a plurality of pixels P in a display area DA, and each of the plurality of pixels P can include a plurality of subpixels SP. In one embodiment, each of the plurality of pixels P can include four subpixels SP1 to SP4. For example, each of the plurality of pixels P can include a first subpixel SP1 emitting red light, a second subpixel SP2 emitting green light, a third subpixel SP3 emitting blue light and a fourth subpixel SP4 emitting white light, but is not limited thereto.

Each of the first to fourth subpixels SP1 to SP4 can include a light emission area EA and a circuit area CA. The light emission area EA can be disposed at one side (or an upper side) of a subpixel area, and the circuit area CA can be disposed at the other side (or a lower side) of the subpixel area. For example, the circuit area CA can be disposed below the light emission area EA based on a second direction (e.g., Y-axis direction). The light emission areas EA of the first to fourth subpixels SP1 to SP4 can have the same size, but are not limited thereto. The light emission areas EA of the first to fourth subpixels SP1 to SP4 can have a different size (or area).

The circuit area CA can be spatially separated from the light emission area EA in the subpixel area, but is not limited thereto. For example, at least a portion of the circuit area CA can overlap with the light emission area EA in the subpixel area, or can be disposed below the light emission area EA. The light emission area EA can be an opening area, a light emission area, a transmissive area or a transmissive portion. The circuit area CA can be a non-emission area NEA or a non-opening area.

Each of the first to fourth subpixels SP1 to SP4 according to one embodiment can further include a transparent area that is disposed near at least one of the light emission area EA or the circuit area CA and transmits external light. In this situation, the light emitting display apparatus can implement a transparent light emitting display apparatus due to light transmission of the transparent portion.

Each of the first to fourth subpixels SP1 to SP4 can include a light extraction unit 140 (e.g., a light extraction part) and a light emitting element 150 in the light emission area EA as shown in FIG. 3.

Referring to FIG. 3, an overcoat layer 130 can be provided over the first substrate 100 provided with a pixel circuit layer 110. The overcoat layer 130 can be provided over the first substrate 100 to cover the pixel circuit layer 110. The overcoat layer 130 can be provided in the other area of the non-display area NDA except for the pad area and the entire display area DA. For example, the overcoat layer 130 can include an extension portion (or an enlarged portion) extended or enlarged toward the other non-display area except for the pad area from the display area DA. Therefore, the overcoat layer 130 can have a relatively wider size than the display area DA.

The overcoat layer 130 can be formed to have a relatively thick thickness to provide a flat surface on the pixel circuit layer 110 (e.g., to provide a planarization function). For example, the overcoat layer 130 can include an organic insulating layer, for example, an organic material such as photo acryl, benzocyclobutene, polyimide and fluorine resin.

The light extraction unit 140 can be provided over an upper surface of the overcoat layer 130 to overlap the light emission area EA of the subpixel SP. The light extraction unit 140 can also be referred to as a light extraction part and is configured to direct more light outside of the device. The light extraction unit 140 can be provided over the overcoat layer 130 to have a curved (or uneven) shape, thereby changing a propagation path of light emitted from the light emitting element 150 to increase light extraction efficiency. For example, the light extraction unit 140 can be a non-flat portion, an uneven pattern portion, a micro lens portion, or a light scattering pattern portion.

The light extraction unit 140 can include a plurality of concave portions 141 and a convex portion 143 disposed near each of the plurality of concave portions 141, which can form a honeycomb pattern in a plan view, but embodiments are not limited thereto. The plurality of concave portions 141 can be formed or configured to be concave from the upper surface of the overcoat layer 130. The convex portion 143 can be disposed between the plurality of concave portions 141. The convex portion 143 can be formed to surround each of the plurality of concave portions 141.

An upper portion of the convex portion 143 can include a pointed tip structure to increase light extraction efficiency, but is not limited thereto. For example, the upper portion of the convex portion 143 can have a convex curved shape. For example, the upper portion of the convex portion 143 can include a convex cross-sectional dome or bell structure, but is not limited thereto.

The convex portion 143 can include an inclined portion having a curved shape between a bottom portion and an upper portion (or a top portion). The inclined portion of the convex portion 143 can form or configure the concave portion 141. For example, the inclined portion of the convex portion 143 can be an inclined surface or a curved surface. The inclined portion of the convex portion 143 according to one embodiment can have a cross-sectional structure of a Gaussian curve. In this situation, the inclined portion of the convex portion 143 can have a tangent slope that gradually increases from the bottom portion to the upper portion and is gradually reduced.

Referring to FIG. 4, each of the plurality of concave portions 141 according to one embodiment of the present disclosure can be disposed in parallel to have a predetermined interval along a first direction (e.g., X-axis direction), and can be alternately disposed along the second direction (e.g., Y-axis direction). Therefore, the light extraction unit 140 (e.g., light extraction part) can include a larger number of concave portions 141 per unit area, thereby increasing external extraction efficiency of light emitted from the light emitting element 150.

According to one embodiment, a central portion C of each of the plurality of concave portions 141 disposed along the first direction (e.g., X-axis direction) can be positioned or aligned in a first straight line SL1 parallel with the first direction (e.g., X-axis direction). The central portion C of each of the plurality of concave portions 141 disposed along the second direction (e.g., Y-axis direction) can be positioned or aligned in a second straight line SL2 parallel with the second direction (e.g., Y-axis direction).

According to another embodiment, the plurality of concave portions 141 can be disposed in a lattice shape. Each of the plurality of concave portions 141 disposed in an even-numbered horizontal line parallel with the first direction (e.g., X-axis direction) can be disposed between the plurality of concave portions 141 disposed in adjacent odd-numbered horizontal lines along the second direction (e.g., Y-axis direction). Therefore, the plurality of concave portions 141 can be positioned or aligned in a zigzag line ZL having a zigzag shape along the first direction (e.g., X-axis direction).

According to one embodiment, the central portion C of each of three adjacent concave portions 141 can form a triangular shape TS. In addition, the central portion C of each of six concave portions 141 disposed near one concave portion 141 or surrounding one concave portion 141 can form a six-angular shape HS in a plan view (e.g., a hexagon shape). For example, each of the plurality of concave portions 141 can be disposed or arranged in a honeycomb structure or a circle structure, but embodiments are not limited thereto.

According to one embodiment of the present disclosure, when the plurality of concave portions 141 are disposed in a honeycomb structure, diagonal center lines DCL1 and DCL2 passing through the central portion C of concave portions 141 disposed along diagonal directions DD1 and DD2 between the first direction (e.g., X-axis direction) and the second direction (e.g., Y-axis direction) can be inclined from each of the first straight line SL1 and the second straight line SL2. For example, a first angle $\theta 1$ between the diagonal center lines DCL1 and DCL2 and the first straight line SL1 can be 30°, and a second angle $\theta 2$ between the diagonal center lines DCL1 and DCL2 and the second straight line SL2 can be 60°.

According to one embodiment of the present disclosure, pitches (or interval L1) between the concave portions 141 respectively disposed in the plurality of subpixels SP constituting one pixel P can be the same as or different from each other. The pitch L1 between the concave portions 141 can be a distance (or interval) between the central portions C of two adjacent concave portions 141.

In one embodiment, the pitches L1 among the concave portions 141 respectively disposed in the red subpixel, the green subpixel, the blue subpixel and the white subpixel can be the same as or different from one another. For example, the pitch L1 between the concave portions 141 disposed in the green subpixel can be different from that between the concave portions 141 disposed in the blue subpixel.

In another embodiment, the concave portions 141 respectively disposed in the red subpixel, the green subpixel, the blue subpixel and the white subpixel can have the same number and/or density or different numbers and/or densities from one another. For example, the number and/or density of the concave portions 141 disposed in each of the white subpixel and the green subpixel can be different from the number and/or density of the concave portions 141 disposed in each of the red subpixel and the blue subpixel.

The convex portion 143 can be configured to individually surround each of the plurality of concave portions 141. Therefore, the light extraction unit 140 can include a plurality of concave portions 141 surrounded by the convex portion 143. The convex portion 143 surrounding one concave portion 141 can have a hexagonal shape (or a honeycomb shape) in a plan view, but the embodiment of the present disclosure is not limited thereto.

Referring back to FIG. 3, the light emitting element 150 can be disposed over the light extraction unit 140 (e.g., light extraction part) that overlaps with the light emission area EA. The light emitting element 150 can be configured to emit light toward the first substrate 100 in accordance with a bottom emission method, but the embodiment of the present disclosure is not limited thereto. The light emitting element 150 according to one embodiment can include an anode electrode AE, a light emitting layer EL and a cathode electrode CE.

The anode electrode AE can be provided over the overcoat layer 130 and electrically connected to a source electrode (or a drain electrode) of a driving thin film transistor. The anode electrode AE can be extended from the light emission area EA to the circuit area CA. One end of the anode electrode AE can be electrically connected to the source electrode (or the drain electrode) of the driving thin film transistor through a driving contact hole in the circuit area CA.

Since the anode electrode AE is directly in contact with the light extraction unit 140, the anode electrode AE can have a shape that follows the shape of the light extraction unit 140. Since the anode electrode AE is provided (or deposited) over the overcoat layer 130 to have a relatively thin thickness, the anode electrode AE can have a surface shape that conforms to a surface morphology of the light extraction unit 140 that includes the convex portion 143 and the plurality of concave portions 141. For example, the anode electrode AE can have the same cross-sectional structure as that of the light extraction unit 140 as the anode electrode AE is formed in a conformal shape, which follows the surface shape (or morphology) of the light extraction unit 140, by a deposition process of a transparent conductive material. For example, the anode electrode AE can have a wavy shape or an egg crate type of shape.

The light emitting layer EL can be provided over the anode electrode AE and can be in direct contact with the anode electrode AE. The light emitting layer EL can be formed (or deposited) on the anode electrode AE to have a relatively thick thickness as compared with the anode electrode AE, thereby having a surface shape different from that of each of the plurality of concave portions 141 and the convex portion 143 or that of the anode electrode AE. For example, the light emitting layer EL can be formed in a non-conformal shape, which does not follow the surface shape (or morphology) of the anode electrode AE, by a deposition process and thus can have a cross-sectional structure different from that of the anode electrode AE.

The light emitting layer EL according to one embodiment can have a thickness that gradually increases toward the bottom surface of the convex portion 143 or the concave portion 141. For example, the light emitting layer EL can be formed on the top of the convex portion 143 to have a first thickness, can be formed on the bottom surface of the concave portion 141 to have a second thickness thicker than the first thickness, and can be formed on the inclined surface (or the curved portion) of the convex portion 143 to have a third thickness thinner than the first thickness. Each of the first to third thicknesses can correspond to a shortest distance between the anode electrode AE and the cathode electrode CE.

The light emitting layer EL according to one embodiment can include two or more organic light emitting layers for emitting white light. For example, the light emitting layer EL can include first and second organic light emitting layers for emitting white light by mixing first light with second light. For example, the first light emitting layer can include one of a blue organic light emitting layer, a green organic light emitting layer, a red organic light emitting layer, a yellow organic light emitting layer and a yellow-green organic light emitting layer to emit the first light. For example, the second organic light emitting layer can include an organic light emitting layer for emitting the second light for implementing white light by mixture with the first light of the blue organic light emitting layer, the green organic light emitting layer, the red organic light emitting layer, the yellow organic light emitting layer and the yellow-green organic light emitting layer. The light emitting layer EL according to another embodiment can include any one of the blue organic light emitting layer, the green organic light emitting layer and the red organic light emitting layer. Additionally, the light emitting layer EL can include a charge generation layer interposed between the first organic light emitting layer and the second organic light emitting layer.

The cathode electrode CE can be provided over the light emitting layer EL and can be in direct contact with the light emitting layer EL. The cathode electrode CE can be formed (or deposited) on the light emitting layer EL to have a relatively thin thickness as compared with the light emitting layer EL. The cathode electrode CE can be formed (or deposited) on the light emitting layer EL to have a relatively thin thickness, thereby having a surface shape that conforms to that of the light emitting layer EL. For example, the cathode electrode CE can be formed in a conformal shape that conforms to the surface shape (or morphology) of the light emitting layer EL by a deposition process to have a cross-sectional structure the same as that of the light emitting layer EL and different from that of the light extraction unit 140. For example, the cathode electrode CE can have a wavy shape or an egg crate type of shape.

The cathode electrode CE according to one embodiment can include a metal material having high reflectance to reflect incident light, which is emitted from the light emitting layer EL, toward the first substrate 100. For example, the cathode electrode CE can include a single layered structure or multi-layered structure made of any one material selected from aluminum (Al), silver (Ag), molybdenum (Mo), gold (Au), magnesium (Mg), calcium (Ca) and barium (Ba), or two or more alloy materials. The cathode electrode CE can include an opaque conductive material having high reflectance.

The light emitting element 150 can emit light by a current supplied by the pixel circuit. The concave portion 141 or the convex portion 143 of the light extraction unit 140 (e.g., light extraction part) increases external extraction efficiency of the light emitted from the light emitting layer EL by changing a path of the light emitted from the light emitting layer EL to a light emitting surface (or light extraction surface). For example, the convex portion 143 can prevent or minimize degradation of light extraction efficiency due to light trapped in the light emitting element 150 by repeating total reflection between the anode electrode AE and the cathode electrode CE of the light emitting element 150 without moving the light emitted from the light emitting element 150 to the light emitting surface. Therefore, the light emitting display apparatus according to one embodiment of the present disclosure can improve light extraction efficiency of the light emitted from the light emitting element 150.

The light emitting display apparatus according to one embodiment of the present disclosure can further include a bank 170. The bank 170 can be provided over the overcoat layer 130. The bank 170 can include an organic material such as a benzocyclobutene (BCB)-based resin, an acryl-based resin or a polyimide resin.

The bank 170 can be provided over the overcoat layer 130 to at least partially cover an edge of the anode electrode AE extended onto the circuit area CA. The light emission area EA defined by the bank 170 can have a size smaller than that of the light extraction unit 140 in a plan view.

The light emitting layer EL of the light emitting element 150 can be provided over the anode electrode AE, the bank 170 and a step difference portion between the anode electrode AE and the bank 170. In this situation, when the light emitting layer EL is formed in the step difference portion between the anode electrode AE and the bank layer 170 to have a relatively thin thickness, the cathode electrode CE can be in electrical contact (or short) with the anode electrode AE. To solve this problem, an end (or outermost bank line) of the bank 170 adjacent to the light emission area EA can be disposed to cover an edge portion of the light extraction unit 140. Therefore, an electrical contact (or short) between the anode electrode AE and the cathode electrode CE can be prevented from occurring due to an end of the bank 170 disposed in the step difference portion between the anode electrode AE and the bank 170.

The light emitting display apparatus according to one embodiment of the present disclosure can further include a color filter 180.

The color filter 180 can be disposed between the first substrate 100 and the overcoat layer 130 to at least partially overlap at least one emission area EA. The color filter 180 according to one embodiment can be disposed below the overcoat layer 130 and at least partially overlap the light emission area EA.

The color filter 180 can have a size larger than that of the light emission area EA. For example, the color filter 180 can have a size larger than that of the light emission area EA and smaller than that of the light extraction unit 140 (e.g., light extraction part), but is not limited thereto. The color filter 180 can have a size larger than that of the light extraction unit 140. For example, when the color filter 180 has a size larger than that of the light extraction unit 140, light leakage, in which internal light moves toward the subpixel SP adjacent thereto, can be reduced or minimized.

The color filter 180 according to one embodiment can include a color filter that transmits only a wavelength of a color, which is set in the subpixel SP among light emitted (or extracted) from the light emitting element 150 to the first substrate 100. For example, the color filter 180 can transmit a red, green or blue wavelength. When one pixel P includes first to fourth subpixels SP adjacent to one another, a color filter provided in the first subpixel can include a red color filter, a color filter provided in the second subpixel can include a green color filter, and a color filter provided in the third subpixel can include a blue color filter. The fourth subpixel may not include a color filter, or can include a transparent material for compensation of a step difference, thereby emitting white light.

The light emitting display apparatus according to one embodiment of the present disclosure can further include an encapsulation layer 200.

The encapsulation layer 200 can be provided over the first substrate 100 to cover the light emitting element 150. The encapsulation layer 200 can be provided over the first substrate 100 to cover the cathode electrode AE. The encapsulation layer 200 can serve to protect the thin film transistor and the light emitting layer EL from external impact and prevent oxygen and/or moisture or particles from being permeated into the cathode electrode CE and the light emitting layer EL.

The encapsulation layer 200 according to one embodiment can include at least one inorganic encapsulation layer and at least one organic encapsulation layer. The organic encapsulation layer can be expressed as a particle cover layer.

The encapsulation layer 200 according to another embodiment can be changed to a filler fully surrounding the display area, and in this situation, the opposing substrate 300 can be bonded to the first substrate 100 via a filler. The filler can include a getter material that absorbs oxygen and/or moisture.

The opposing substrate 300 can be coupled to the encapsulation layer 200. The opposing substrate 300 can include a plastic material, a glass material or a metal material. For example, when the encapsulation layer 200 includes a plurality of inorganic encapsulation layers, the opposing substrate 300 can be omitted.

Optionally, when the encapsulation layer 200 is changed to the filler, the opposing substrate 300 can be coupled to the filler, and in this situation, the opposing substrate 300 can be made of a plastic material, a glass material or a metal material.

Referring back to FIG. 2, the first to fourth subpixels SP1 to SP4 can be disposed adjacent to one another along the first direction (e.g., X-axis direction). Two data lines DL extended along the second direction (e.g., Y-axis direction) can be disposed between the first subpixel SP1 and the second subpixel SP2 and between the third subpixel SP3 and the fourth subpixel SP4 in parallel with each other. A pixel power line VDDL extended along the second direction (e.g., Y-axis direction) can be disposed at one side of the first subpixel SP1 or the fourth subpixel SP4. A reference line RL extended along the second direction (e.g., Y-axis direction) can be disposed between the second subpixel SP2 and the third subpixel SP3. The reference line RL can be used as a sensing line for sensing a characteristic change of the driving thin film transistor disposed in the circuit area CA and/or a characteristic change of the light emitting element from the outside during a sensing driving mode of the pixel P. A gate line GL extended along the first direction X can be disposed below the circuit area CA of each of the first to fourth subpixels SP1 to SP4.

Each of the first to fourth subpixels SP1 to SP4 can include a pixel circuit in the circuit area CA. The pixel circuit can be connected to the gate line GL, the data line DL and the pixel power line VDDL, which are provided to be adjacent to the circuit area CA. The pixel circuit controls a current flowing in the light emitting element 150 in accordance with a data signal from the data line DL in response to a scan pulse from the gate line GL based on a pixel power source supplied from the pixel power line VDDL. The pixel circuit can include at least one transistor and a capacitor.

The at least one transistor can include a driving transistor and switching transistors. The switching transistor can be switched in accordance with the scan pulse supplied to the gate line GL to charge a data voltage, which is supplied from the data line DL, in the capacitor.

The driving transistor can be switched in accordance with a voltage supplied from the switching transistor or the data voltage charged in the capacitor to generate a data current from the power source supplied from the pixel power line VDDL and supply the data current to the light emitting element 150 of the first to fourth subpixels SP1 to SP4.

In the light emitting display apparatus according to one embodiment of the present disclosure, in addition to at least one transistor and the capacitor, contact portions for electrically connecting the light emitting element 150 with the driving transistor can be further disposed in the circuit area CA. A size of the circuit area CA can be increased in accordance with positions of the driving transistor and the contact portions, whereby the size of the light emission area EA can be reduced.

The light emitting display apparatus according to one embodiment of the present disclosure can include a driving transistor and specific types of contact portions, which are capable of minimizing the size of the circuit area CA. Hereinafter, the driving transistor and the plurality of contact portions, which are provided in the circuit area CA, will be described in detail with reference to FIGS. 5 to 11.

Figure 6:
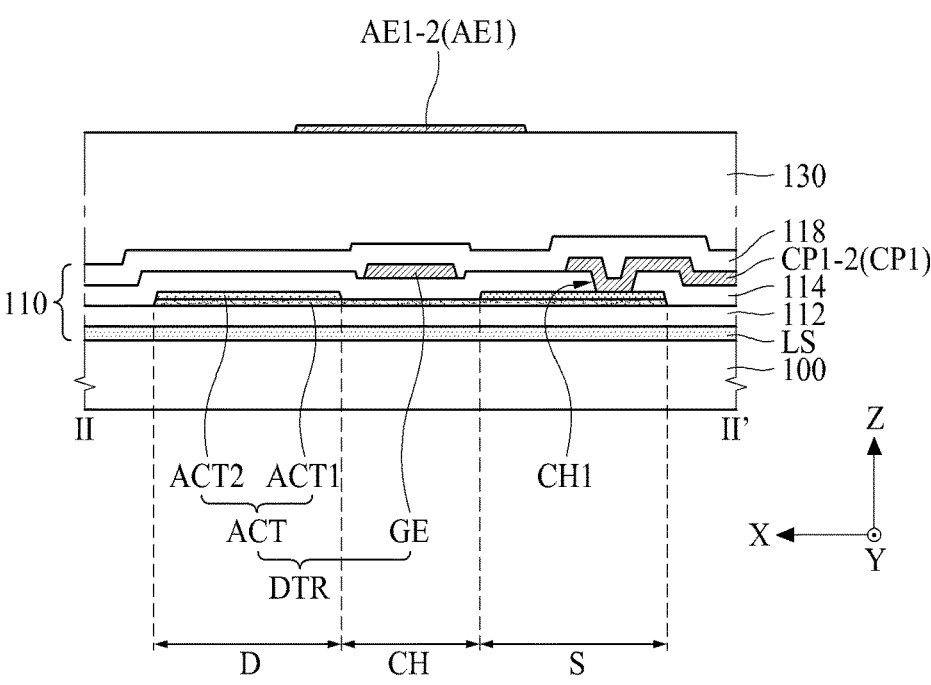
FIG. 6 is a cross-sectional view illustrating II-II' shown in the driving transistor of FIG. 5 according to an embodiment of the present disclosure.
Figure 7:
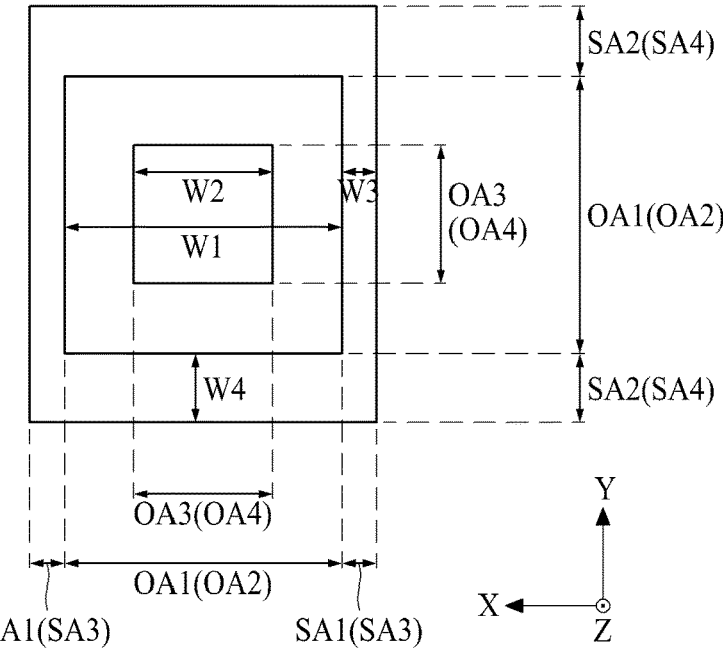
FIG. 7 is a plan view illustrating an opening area of holes provided in a driving contact portion and a welding contact portion, which are shown in FIG. 5, according to an embodiment of the present disclosure.

FIG. 5 is a plan view illustrating a driving transistor and contact portions, which are provided in the circuit area of FIG. 2 according to an embodiment of the present disclosure, and FIG. 6 is a cross-sectional view illustrating II-II' shown in the driving transistor of FIG. 5 according to an embodiment of the present disclosure. FIG. 7 is a plan view illustrating an opening area of holes provided in a driving contact portion and a welding contact portion according to an embodiment of the present disclosure, which are shown in FIG. 5, FIG. 8 is a cross-sectional view illustrating III-III' shown in the driving contact portion and the welding contact portion of FIG. 5 according to an embodiment of the present disclosure, FIG. 9 is a cross-sectional view illustrating IV-IV' shown in the driving contact portion of FIG. 5 according to an embodiment of the present disclosure, and FIG. 10 is a cross-sectional view illustrating V-V' shown in the welding contact portion of FIG. 5 according to an embodiment of the present disclosure. FIG. 11 is a cross-sectional view illustrating an example in which laser is irradiated to the welding contact portion of FIG. 5 according to an embodiment of the present disclosure.

For convenience of description, the first substrate 100, the pixel circuit layer 110, the overcoat layer 130 and anode electrodes AE1 and AE2 are only shown in FIGS. 6 and 8 to 11, but the present disclosure is not limited thereto. It is not excluded that at least one of the light emitting layer EL, the cathode electrode CE, the encapsulation layer 200 or the second substrate 300 is stacked in the circuit area CA.

Referring to FIGS. 2 and 5, each of the first to fourth subpixels SP1 to SP4 can include a driving transistor DTR disposed in the circuit area CA. The driving transistor DTR is provided in the pixel circuit layer 110, and can include an active layer ACT and a gate electrode GE.

A light shielding layer LS can be provided over the first substrate 100. The light shielding layer LS can minimize or prevent a change in a threshold voltage of the driving transistor DTR due to external light. The light shielding layer LS can include a conductive material, for example, a single layer or multi-layer made of any one of molybdenum (Mo), aluminum (Al), chromium (Cr), gold (Au), titanium (Ti), nickel (Ni), neodymium (Nd) and copper (Cu) or their alloy. In this situation, a buffer layer 112 can be provided between the light shielding layer LS and the active layer ACT. The buffer layer 112 can be an inorganic insulating layer, and can include a silicon oxide layer (SiOx), a silicon nitride layer (SiNx) or a multi-layer thereof.

The active layer ACT can be provided over the buffer layer 112. The active layer ACT can include a first active layer ACT1 and a second active layer ACT2. The first active layer ACT1 can be a semiconductor layer, and can include a semiconductor material based on any one of amorphous silicon, polycrystalline silicon, oxide and an organic material. For example, the first active layer ACT1 can include indium gallium zinc oxide (IGZO).

The second active layer ACT2 can be provided over the first active layer ACT1. The second active layer ACT2 can be a conductive layer, and can include any one of metals, such as aluminum (Al), gold (Au), silver (Ag), copper (Cu), tungsten (W), molybdenum (Mo), chromium (Cr), tantalum (Ta) and titanium (Ti), or their alloy. For example, the second active layer ACT2 can include molybdenum titanium (MoTi).

The second active layer ACT2 can be provided in an area other than a channel area CH of the driving transistor DTR on the first active layer ACT1. That is, only the first active layer ACT1 can be provided in the channel area CH of the driving transistor DTR. The active layer ACT can have a structure in which the first active layer ACT1 and the second active layer ACT2 are stacked on each other in a source area S and a drain area D of the driving transistor DTR. The second active layer ACT2 provided in the source area S of the driving transistor DTR corresponds to the source electrode of the driving transistor DTR, and the second active layer ACT2 provided in the drain area D of the driving transistor DTR can correspond to the drain electrode of the driving transistor DTR.

A gate insulating layer 114 can be provided over the active layer ACT. The gate insulating layer 114 can be formed on only the active layer ACT (e.g., or only under the gate electrode GE), or can be formed on the entire surface of the first substrate 100 or the buffer layer 112, which includes the active layer ACT. The gate insulating layer 114 can include an inorganic insulating layer, for example, a silicon oxide layer (SiOx), a silicon nitride layer (SiNx) or a multi-layer thereof.

The gate electrode GE can be provided over the gate insulation layer 114 to at least partially overlap with the channel area CH of the driving transistor DTR. The gate electrode GE can include a single layer or multi-layer made of any one of molybdenum (Mo), aluminum (Al), chromium (Cr), gold (Au), titanium (Ti), nickel (Ni), neodymium (Nd) and copper (Cu) or their alloy.

A passivation layer 118 can be provided to cover the pixel circuit that includes the driving transistor DTR. The passivation layer 118 can be an inorganic insulating layer, and can include, for example, a silicon oxide layer (SiOx), a silicon nitride layer (SiNx) or a multi-layer thereof.

An overcoat layer 130 can be provided over the pixel circuit layer 110, in which the driving transistor DTR is formed, to planarize a step difference caused by the driving transistor DTR.

In each of the first to fourth subpixels SP1 to SP4, two contact portions for electrically connecting the light emitting element 150 with the driving transistor DTR can be disposed in the circuit area CA. The contact portions can include a driving contact portion DCT and a welding contact portion WCT.

The driving contact portion DCT corresponds to a contact portion for electrically connecting the light emitting element 150 disposed in the light emission area EA of a specific subpixel with the driving transistor DTR disposed in the circuit area CA of a specific subpixel.

In detail, the plurality of pixels P can include a first pixel P1 and a second pixel P2, which are disposed adjacent to each other. The second pixel P2 can be disposed adjacent to the first pixel P1 in the second direction (e.g., Y-axis direction). Each of the first pixel P1 and the second pixel P2 can include a plurality of subpixels, for example, first to fourth subpixels SP1 to SP4 arranged in the first direction (e.g., X-axis direction). Each of the first to fourth subpixels SP1 to SP4 can include a light emission area EA and a circuit area CA.

The driving contact portion DCT can electrically connect the light emitting element 150 disposed in the light emission area EA of a subpixel SP1-1 provided in the first pixel P1 with the driving transistor DTR disposed in the circuit area CA of the subpixel SP1-1 provided in the first pixel P1. In this situation, the subpixel SP1-1 provided in the first pixel P1 can be one of the first to fourth subpixels SP1 to SP4 provided in the first pixel P1.

The driving contact portion DCT can include at least one insulating layer that includes a first connection electrode CP1 (e.g., CP1-1, CP1-2 and CP1-3) and a driving contact hole.

The first connection electrode CP1 can be electrically connected to the driving transistor DTR. The first connection electrode CP1 can include a first electrode pattern CP1-1 (e.g., FIG. 8) and a second electrode pattern CP1-2 (e.g., FIG. 6). For example, as shown in FIG. 5, the second electrode pattern CP1-2 and the third electrode pattern CP1-3 can protrude or extend from the first electrode pattern CP1-1. Also, the second electrode pattern CP1-2 and the third electrode pattern CP1-3 can be disposed on opposite sides of the welding contact portion WCT.

In one embodiment, the first electrode pattern CP1-1 and the second electrode pattern CP1-2 of the first connection electrode CP1 can be provided as one layer. The first electrode pattern CP1-1 and the second electrode pattern CP1-2 of the first connection electrode CP1 can be provided on the same layer as the gate electrode GE of the driving transistor DTR. The light shielding layer LS can be provided below the first connection electrode CP1 to shield external light incident on the first connection electrode CP1. In addition, a circuit pattern CCP can be provided between the first connection electrode CP1 and the light shielding layer LS, and can be provided on the same layer as the active layer ACT of the driving transistor DTR, but is not limited thereto.

The first electrode pattern CP1-1 of the first connection electrode CP1 can be provided to overlap with the driving contact hole. The first electrode pattern CP1-1 of the first connection electrode CP1 can be exposed in an area overlapped with the driving contact hole. The first electrode pattern CP1-1 of the first connection electrode CP1 can be electrically connected to the light emitting element 150 of the subpixel SP1-1 provided in the first pixel P1, especially the first anode electrode AE1 through the driving contact hole (e.g., see FIG. 5).

Referring to FIGS. 7, 8 and 9, at least one insulating layer, which includes a driving contact hole, can be provided over the first electrode pattern CP1-1 of the first connection electrode CP1. The at least one insulating layer can include at least one of an organic insulating layer or an inorganic insulating layer. For example, the organic insulating layer can include the overcoat layer 130, and the inorganic insulating layer can include the passivation layer 118.

The overcoat layer 130 is provided over the first connection electrode CP1. The overcoat layer 130 can include a first driving contact hole DH1 (e.g., FIG. 8) that overlaps with at least a portion of the first connection electrode CP1, especially the first electrode pattern CP1-1. The first driving contact hole DH1 can include a first opening area OA1 passing through the overcoat layer 130, a first inclined area SA1 forming a first inclined surface S1 on the overcoat layer 130 and a second inclined area SA2 forming a second inclined surface S2 on the overcoat layer 130. The first opening area OA1 of the overcoat layer 130 is formed through a photo process that uses a full-tone photo mask. The first inclined area SA1 and the second inclined area SA2 of the overcoat layer 130 can be formed through a photo process that uses a half-tone photo mask.

The first driving contact hole DH1 of the overcoat layer 130 can include a first inclined surface S1 provided on a first side directed toward the welding contact portion WCT and a second side facing the first side, and a second inclined surface S2 provided on a third side directed toward the light emission area EA of the subpixel SP1-1 provided in the first pixel P1 and a fourth side facing the third side. The first inclined surface S1 and the second inclined surface S2, which are formed in the first driving contact hole DH1 of the overcoat layer 130 according to one embodiment of the present disclosure, can have their respective inclinations different from each other.

In one embodiment, a first inclination θ1 of the first inclined surface S1 can be greater than a second inclination θ2 of the second inclined surface S2. The inclination of each of the first inclined surface S1 and the second inclined surface S2 can be determined depending on a width of a half-tone photo mask. As shown in FIG. 7, the first inclined surface S1 can be formed using a half-tone photo mask having a third width W3, and the second inclined surface S2 can be formed using a half-tone photo mask having a fourth width W4 greater than the third width W3. The first inclined surface S1 can be formed to have a steep inclination by using a half-tone photo mask having a small width. On the other hand, the second inclined surface S2 can be formed to have a gentle inclination by using a half-tone photo mask having a large width.

The passivation layer 118 can be provided between the overcoat layer 130 and the first connection electrode CP1. The passivation layer 118 can include a second driving contact hole DH2 that at least partially overlaps with the first driving contact hole DH1 of the overcoat layer 130. For example, the second driving contact hole DH2 can be located under the first driving contact hole DH. The first driving contact hole DH1 can be larger than the second driving contact hole DH2, and the first and second driving contact holes DH1, DH2 can overlap with each other. The second driving contact hole DH2 of the passivation layer 118 can include a third opening area OA3 that exposes the first electrode pattern CP1-1 of the first connection electrode CP1 by passing through the passivation layer 118. The third opening area OA3 of the passivation layer 118 can be formed through a wet etching process.

The third opening area OA3 of the passivation layer 118 can be disposed in the first opening area OA1 of the overcoat layer 130, and can have a size smaller than that of the first opening area OA1. For example, the first opening area OA1 of the overcoat layer 130 can have a rectangular shape having a first width W1 as shown in FIG. 7, and the third opening area OA3 of the passivation layer 118 can have a rectangular shape having a second width W2 smaller than the first width W1 (e.g., W1>W2), but the present disclosure is not limited thereto. The first opening area OA1 of the overcoat layer 130 and the third opening area OA3 of the passivation layer 118 can be formed in one of various shapes such as a circular shape, an oval shape and a polygonal shape. The first driving contact hole DH1 of the overcoat layer 130 can expose the second driving contact hole DH2 of the passivation layer 119 and a portion of an upper surface of the passivation layer 118.

The first electrode pattern CP1-1 of the first connection electrode CP1 can be electrically connected to the first anode electrode AE1 of the subpixel SP1-1 provided in the first pixel P1 through the driving contact hole DCT that includes the first driving contact hole DH1 of the overcoat layer 130 and the second driving contact hole DH2 of the passivation layer 118.

The subpixel SP1-1 provided in the first pixel P1 can include the light emitting element 150 that includes the first anode electrode AE1. The first anode electrode AE1 can include a first light emitting portion AE1-1 disposed in the light emission area EA of the subpixel SP1-1 provided in the first pixel P1 and a first connection portion AE1-2 disposed in the circuit area CA of the subpixel SP1-1 provided in the first pixel P1 (e.g., see FIG. 5).

The first connection portion AE1-2 can protrude from the first light emitting portion AE1-1 and extend in a direction of the circuit area CA. The first connection portion AE1-2 can have one end provided to overlap with the driving contact hole. In detail, the first connection portion AE1-2 can be provided in the driving contact hole that includes the first driving contact hole DH1 of the overcoat layer 130 and the second driving contact hole DH2 of the passivation layer 118. The first connection portion AE1-2 can be in direct contact with the first electrode pattern CP1-1 of the first connection electrode CP1 in the driving contact hole. Therefore, the first anode electrode AE1 can be electrically connected to the first connection electrode CP1.

Meanwhile, as shown in FIG. 5, the second electrode pattern CP1-2 of the first connection electrode CP1 can protrude from the first electrode pattern CP1-1 and extend to an area overlapped with the driving transistor DTR. The second electrode pattern CP1-2 of the first connection electrode CP1 can be provided between the welding contact portion WCT and the light emission area EA provided in the subpixel SP1-1 of the first pixel P1. That is, the second electrode pattern CP1-2 of the first connection electrode CP1 can be provided between the welding contact portion WCT and the first light emitting portion AE1-1 of the first anode electrode AE1 provided in the subpixel SP1-1 of the first pixel P1.

The second electrode pattern CP1-2 of the first connection electrode CP1 can be electrically connected to the second active layer ACT2 disposed in the source area S or the drain area D through a first contact hole CH1 passing through the gate insulating layer 114 as shown in FIG. 6. As a result, the first anode electrode AE1 can be electrically connected to the driving transistor DTR through the first connection electrode CP1. Therefore, the first anode electrode AE1 can be supplied with a pixel power source from the driving transistor DTR.

Referring back to FIG. 5, the welding contact portion WCT corresponds to a contact portion for electrically connecting the light emitting element 150 disposed in the light emission area EA of an adjacent subpixel disposed adjacent to a specific subpixel with the driving transistor DTR disposed in the circuit area CA of a specific subpixel.

In detail, the welding contact portion WCT can electrically connect the light emitting element 150 disposed in the light emission area EA of the adjacent subpixel SP1-2 provided in the second pixel P2 with the driving transistor DTR disposed in the circuit area CA of the subpixel SP1-1 provided in the first pixel P1. In this situation, the adjacent subpixel SP1-2 provided in the second pixel P2 can be one of the first to fourth subpixels SP1 to SP4 provided in the second pixel P2, and can emit light of the same color as that of the subpixel SP1-1 provided in the first pixel P1.

In the light emitting display apparatus according to one embodiment of the present disclosure, when a defect occurs in the driving transistor of the adjacent subpixel SP1-2 provided in the second pixel P2, the driving transistor DTR of the subpixel SP1-1 provided in the first pixel P1 can be electrically connected with the light emitting element 150 of the adjacent subpixel SP1-2 through the welding contact portion WCT. Therefore, in the light emitting display apparatus according to one embodiment of the present disclosure, in spite of the defect of the driving transistor, the light emitting element 150 of the adjacent subpixel SP1-2 can operate normally. For example, the welding contact portion WCT can provide a type of fail-over option for allowing the subpixel to be driven by the driving transistor of an adjacent subpixel if its own driving transistor turns out to be defective (e.g., two subpixels of the same color in adjacent rows can be tied together, see FIGS. 1 and 2).

The welding contact portion WCT can electrically separate the driving transistor DTR of the subpixel SP1-1 provided in the first pixel P1 from the light emitting element 150 of the adjacent subpixel SP1-2 when the driving transistor of the adjacent subpixel SP1-2 provided in the second pixel P2 is normal. On the other hand, when a defect does occurs in the driving transistor of the adjacent subpixel SP1-2 provided in the second pixel P2 (e.g., due to problems during manufacture), the welding contact portion WCT can electrically connect the light emitting element 150 of the adjacent subpixel SP1-2 with the driving transistor DTR of the subpixel SP1-1 provided in the first pixel P1 through laser irradiation (e.g., two subpixels of the same color in adjacent rows can be tied together and the occurrence of a dead subpixel can be avoided, see FIGS. 1 and 2).

The welding contact portion WCT can include at least one insulating layer that includes a second connection electrode CP2 and a welding contact hole.

Referring to FIGS. 7, 8 and 10, the second connection electrode CP2 can be electrically connected to the driving transistor DTR of the subpixel SP1-1 provided in the first pixel P1. The second connection electrode CP2 can be provided on a different layer than the first connection electrode CP1. In one embodiment, the second connection electrode CP2 can be provided on the same layer as the light shielding layer LS. The second connection electrode CP2 can be extended from the light shielding layer LS and formed as one layer, but is not limited thereto. The second connection electrode CP2 can be formed as one pattern spaced apart from the light shielding layer LS.

The second connection electrode CP2 can be provided to overlap with the welding contact hole. The second connection electrode CP2 can be spaced apart from the light emitting element 150 of the adjacent subpixel SP1-2 provided in the second pixel P2, especially the second anode electrode AE2 with an insulating layer, for example, the buffer layer 112 interposed therebetween in an area overlapped with the welding contact hole. The second connection electrode CP2 can be electrically separated from the second anode electrode AE2 of the adjacent subpixel SP1-2.

At least one insulating layer that includes the welding contact hole can be provided over the second connection electrode CP2. The at least one insulating layer can include at least one of an organic insulating layer or an inorganic insulating layer. For example, the organic insulating layer can include the overcoat layer 130, and the inorganic insulating layer can include the passivation layer 118.

The overcoat layer 130 can include a first welding contact hole WH1 provided on the second connection electrode CP2 and overlapped with at least a portion of the second connection electrode CP2. The first welding contact hole WH1 of the overcoat layer 130 can include a second opening area OA2 passing through the overcoat layer 130, a third inclined area SA3 forming a third inclined surface S3 on the overcoat layer 130 and a fourth inclined area SA4 forming a fourth inclined surface S4 on the overcoat layer 130. The second opening area OA2 of the overcoat layer 130 can be formed through a photo process that uses a full-tone photo mask, and the third inclined area SA3 and the fourth inclined area SA4 of the overcoat layer 130 can be formed through a photo process that uses a half-tone photo mask.

The first welding contact hole WH1 of the overcoat layer 130 can include a third inclined surface S3 provided on a first side directed toward the driving contact portion DCT and a second side facing the first side, and a fourth inclined surface S4 provided on a third side directed toward the light emission area EA of the subpixel SP1-1 provided in the first pixel P1 and a fourth side facing the third side. The third inclined surface S3 and the fourth inclined surface S4, which are formed in the first welding contact hole WH1 of the overcoat layer 130 according to one embodiment of the present disclosure, can have their respective inclinations different from each other.

In one embodiment, a third inclination θ3 of the third inclined surface S3 can be greater than a fourth inclination θ4 of the fourth inclined surface S4. The inclination of each of the third inclined surface S3 and the fourth inclined surface S4 can be determined depending on a width of a half-tone photo mask. As shown in FIG. 7, the third inclined surface S3 can be formed using a half-tone photo mask having a third width W3, and the fourth inclined surface S4 can be formed using a half-tone photo mask having a fourth width W4 greater than the third width W3 (e.g., W4>W3). The third inclined surface S3 can be formed to have a steep inclination by using a half-tone photo mask having a small width. On the other hand, the fourth inclined surface S4 can be formed to have a gentle inclination by using a half-tone photo mask having a large width.

The passivation layer 118 can be provided between the overcoat layer 130 and the second connection electrode CP2. The passivation layer 118 can include a second welding contact hole WH2 that at least partially overlaps with the first welding contact hole WH1 of the overcoat layer 130. The second welding contact hole WH2 of the passivation layer 118 can include a fourth opening area OA4 that passes the passivation layer 118. The fourth opening area OA4 of the passivation layer 118 can be formed through a wet etching process. Also, the first welding contact hole WH1 can be larger than the second welding contact hole WH2, and the first welding contact hole WH1 can be located over the second welding contact hole WH2. The first and second welding contact hole WH1, WH2 can overlap with each other.

The fourth opening area OA4 of the passivation layer 118 can be disposed in the second opening area OA2 of the overcoat layer 130, and can have a size smaller than that of the second opening area OA2 (e.g., OA4<OA2). For example, the second opening area OA2 of the overcoat layer 130 can have a rectangular shape having a first width W1 as shown in FIG. 7, and the fourth opening area OA4 of the passivation layer 118 can have a rectangular shape having a second width W2 smaller than the first width W1 (e.g., W2<W1), but the present disclosure is not limited thereto. The second opening area OA2 of the overcoat layer 130 and the fourth opening area OA4 of the passivation layer 118 can be formed in one of various shapes such as a circular shape, an oval shape and a polygonal shape. The first welding contact hole WH1 of the overcoat layer 130 can expose the second welding contact hole WH2 of the passivation layer 119 and a portion of the upper surface of the passivation layer 118.

The welding contact hole, which includes the first welding contact hole WH1 of the overcoat layer 130 and the second welding contact hole WH2 of the passivation layer 118, can correspond to a welding point for irradiating laser to electrically connect the second anode electrode AE2 of the adjacent subpixel SP1-2 with the second connection electrode CP2 when a defect occurs in the driving transistor of the adjacent subpixel SP1-2 provided in the second pixel P2.

When the driving transistor of the adjacent subpixel SP1-2 provided in the second pixel P2 is operating as normal (e.g., non-defective), then the second connection electrode CP2 can remain electrically separated from the second anode electrode AE2 of the adjacent subpixel SP1-2 with the buffer layer 112 interposed therebetween in the welding contact hole that includes the first welding contact hole WH1 of the overcoat layer 130 and the second welding contact hole WH2 of the passivation layer 118, as shown in FIGS. 8 and 10.

On the other hand, when a defect occurs in the driving transistor of the adjacent subpixel SP1-2 provided in the second pixel P2, the second connection electrode CP2 can be electrically connected to the second anode electrode AE2 of the adjacent subpixel SP1-2, which was previously electrically separated therefrom, by irradiating laser to the welding contact hole as shown in FIG. 11. For example, in this way, the two adjacent subpixels can be tied together and driven by the same driving transistor, and the presence of a dead subpixel can be avoided.

In detail, the subpixel SP1-2 provided in the second pixel P2 can include the light emitting element 150 that includes the second anode electrode AE2. The second anode electrode AE2 can include a second light emitting portion AE1-1 disposed in the light emission area EA of the subpixel SP1-2 provided in the second pixel P2 and a second connection portion AE1-2 disposed in the circuit area CA of the subpixel SP1-1 provided in the first pixel P1.

The second connection portion AE2-2 can be protrude from the second light emitting portion AE-1 and extend in the direction of the circuit area CA of the subpixel SP1-1 provided in the first pixel P1. The second connection portion AE2-2 can be provided to have one end overlapped with the welding contact hole. The second connection portion AE2-2 of the second anode electrode AE2 can be provided in the welding contact hole that includes the first welding contact hole WH1 of the overcoat layer 130 and the second welding contact hole WH2 of the passivation layer 118, and can be electrically separated from the second connection electrode CP with the buffer layer 112 interposed therebetween in the welding contact hole.

When the laser is irradiated to the welding contact hole, especially the welding point corresponding to the second welding contact hole WH2 of the passivation layer 118, the second connection portion AE2-2 of the second anode electrode AE2 can be contacted with the second connection electrode CP2 in the welding contact hole as shown in FIG.

11. Therefore, the second anode electrode AE2 can be electrically connected to the second connection electrode CP2.

The second connection electrode CP2 can be electrically connected to the driving transistor DTR through the first connection electrode CP1. In one embodiment, the first connection electrode CP1 can further include a third electrode pattern CP1-3. The first electrode pattern CP1-1, the second electrode pattern CP1-2 and the third electrode pattern CP1-3 of the first connection electrode CP1 can be provided as one layer.

As shown in FIG. 5, the third electrode pattern CP1-3 of the first connection electrode CP1 can protrude from the first electrode pattern CP1-1 and extend to an area below the welding contact portion WCT. The third electrode pattern CP1-3 of the first connection electrode CP1 can be provided between the welding contact portion WCT and the light emission area EA provided in the adjacent subpixel SP1-2 of the second pixel P2. That is, the third electrode pattern CP1-3 of the first connection electrode CP1 can be provided between the welding contact portion WCT and the second light emitting portion AE1-1 of the second anode electrode AE2 provided in the adjacent subpixel SP1-2 of the second pixel P2.

The third electrode pattern CP1-3 of the first connection electrode CP1 can be electrically connected to the second connection electrode CP2 through a second contact hole CH2 passing through the buffer layer 112 as shown in FIG. 10. Meanwhile, as shown in FIG. 6, the second electrode pattern CP1-2 of the first connection electrode CP1 can be electrically connected to the second active layer ACT2 disposed in the source area S or the drain area D through the first contact hole CH1 passing through the gate insulating layer 114. As a result, the second anode electrode AE2 can be electrically connected to the driving transistor DTR through the first connection electrode CP1 and the second connection electrode CP2. Therefore, the second anode electrode AE2 can be supplied with the pixel power source from the driving transistor DTR provided in the subpixel SP1-1 of the first pixel P1.

The light emitting display apparatus according to one embodiment of the present disclosure can include a light extraction unit 140 (e.g., light extraction part), thereby improving light extraction efficiency of light emitted from the light emitting element layer. Therefore, the light emitting display apparatus according to one embodiment of the present disclosure can have high light emission efficiency even with low power, thereby reducing power consumption.

In the light emitting display apparatus according to one embodiment of the present disclosure, the driving contact portion DCT and the welding contact portion WCT can be disposed adjacent to each other in the first direction (e.g., X-axis direction). In detail, in the light emitting display apparatus according to one embodiment of the present disclosure, the driving contact portion and the welding contact portion WCT in the circuit area CA provided in one subpixel area can be disposed adjacent to each other on a first line parallel with the first direction (e.g., X-axis direction). For example, the first line can be an imaginary line extending in a horizontal direction, and the driving contact portion DCT and the welding contact portion WCT can be both be disposed along the first line. At least a portion of each of the driving contact portion DCT and the welding contact portion WCT can overlap with the first line. The first line can be a line parallel with a second line in which the first to fourth subpixels SP1 to SP4 provided in one pixel P are arranged. That is, the driving contact portion DCT and the welding contact portion WCT can be disposed in the same direction as the direction in which the first to fourth subpixels SP1 to SP4 provided in one pixel P are arranged.

In the light emitting display apparatus according to one embodiment of the present disclosure, the driving contact portion DCT and the welding contact portion WCT can be disposed adjacent to each other in the first direction (e.g., X-axis direction), whereby the size of the circuit area CA can be reduced. A length of the circuit area CA in the first direction (e.g., X-axis direction) is determined by a length of the light emission area EA in the first direction (e.g., X-axis direction) and thus cannot be randomly reduced. In addition, when the length of the circuit area CA in the first direction (e.g., X-axis direction) is reduced, the length of the light emission area EA in the first direction (e.g., X-axis direction) is also reduced, whereby the size of the light emission area EA can be reduced. Therefore, it is not preferable to reduce the size of the circuit area CA by reducing the length of the circuit area CA in the first direction (e.g., X-axis direction).

On the other hand, a length of the circuit area CA in the second direction (e.g., Y-axis direction) can have a reverse relation with a length of the light emission area EA in the second direction (e.g., Y-axis direction). When the length of the circuit area CA in the second direction (e.g., Y-axis direction) is reduced, the length of the light emission area EA in the second direction (e.g., Y-axis direction) can be increased. In the light emitting display apparatus according to one embodiment of the present disclosure, the driving contact portion DCT and the welding contact portion WCT can be disposed adjacent to each other in the first direction (e.g., X-axis direction) so that the length of the circuit area CA in the second direction (e.g., Y-axis direction) can be reduced. Therefore, in the light emitting display apparatus according to one embodiment of the present disclosure, the length of the light emission area EA in the second direction (e.g., Y-axis direction) can be increased, and consequently the size of the light emission area EA can be increased.

Meanwhile, in the light emitting display apparatus according to one embodiment of the present disclosure, the inclined surfaces respectively formed in the first driving contact hole DH1 of the driving contact portion DCT and the first welding contact hole WH1 of the welding contact portion WCT can have their respective inclinations different from each other.

In detail, the first driving contact hole DH1 of the driving contact portion DCT passing through the overcoat layer 130 can include a first inclined surface S1 provided on a first side directed toward the welding contact portion WCT and a second side facing the first side and a second inclined surface S2 provided on a third side directed toward the light emission area EA of the subpixel SP1-1 provided in the first pixel P1 and a fourth side facing the third side. In the light emitting display apparatus according to one embodiment of the present disclosure, a first gradient $\theta1$ of the first inclined surface S1 formed in the first driving contact hole DH1 can be formed to be greater than a second inclination $\theta2$ of the second inclined surface S2.

Also, the first welding contact hole WH1 of the welding contact portion WCT passing through the overcoat layer 130 can include a third inclined surface S1 provided on a first side directed toward the driving contact portion DCT and a second side facing the first side and a fourth inclined surface S4 provided on a third side directed toward the light emission area EA of the subpixel SP1-1 provided in the first pixel P1 and a fourth side facing the third side. In the light emitting display apparatus according to one embodiment of the present disclosure, a third gradient $\theta1$ of the third inclined surface S3 formed in the first welding contact hole WH1 can be formed to be greater than a fourth inclination $\theta4$ of the fourth inclined surface S4.

That is, the first driving contact hole DH1 of the driving contact portion DCT and the first welding contact hole WH1 of the welding contact portion WCT can be formed such that an inclined surface formed between the driving contact portion DCT and the welding contact portion WCT has a high inclination. Therefore, in the light emitting display apparatus according to one embodiment of the present disclosure, the driving contact portion DCT and the welding contact portion WCT can be disposed in the first direction (e.g., X-axis direction) and at the same time the sizes of the first driving contact hole DH1 of the driving contact portion DCT and the first welding contact hole WH1 of the welding contact portion WCT can be increased.

The first driving contact hole DH1 of the driving contact portion DCT and the first welding contact hole WH1 of the welding contact portion WCT, which are formed in the overcoat layer 130, can be increased in size as necessary during a manufacturing process. In particular, the size of each of the first opening area OA1 of the first driving contact hole DH1 of the driving contact portion DCT and the second opening area OA2 of the first welding contact hole WH1 of the welding contact portion WCT can be increased. When the size of each of the first opening area OA1 of the first driving contact hole DH1 of the driving contact portion DCT and the second opening area OA2 of the first welding contact hole WH1 of the welding contact portion WCT is increased, a distance between the first driving contact hole DH1 of the driving contact portion DCT and the first welding contact hole WH1 of the welding contact portion WCT can be reduced. When a minimum interval is not obtained between a half-tone mask for forming the inclined surface of the first driving contact hole DH1 of the driving contact portion DCT and a half-tone mask for forming the inclined surface of the first welding contact hole WH1 of the welding contact portion WCT, the inclined surface may not be formed in a desired shape between the first driving contact hole DH1 and the first welding contact hole WH1, whereby it is difficult to stably form the anode electrode formed in each of the first driving contact hole DH1 and the first welding contact hole WH1.

In order to stably form the anode electrode, when a minimum interval is obtained between the half-tone mask for forming the inclined surface of the first driving contact hole DH1 of the driving contact portion DCT and the half-tone mask for forming the inclined surface of the first welding contact hole WH1 of the welding contact portion WCT, a length of an area, in which the driving contact portion DCT and the welding contact portion WCT are formed, in the first direction (e.g., X-axis direction) can be increased. Since the length of each of the light emission area EA and the circuit area CA in the first direction (X-axis direction) is reduced in situation of higher resolution, the first driving contact hole DH1 of the driving contact portion DCT and the first welding contact hole WH1 of the welding contact portion WCT can be disposed in the second direction (e.g., Y-axis direction) without being disposed in the first direction (e.g., X-axis direction). In this situation, the size of the circuit area CA can be increased and thus the size of the light emission area EA can be reduced.

In the light emitting display apparatus according to one embodiment of the present disclosure, when the first driving contact hole DH1 of the driving contact portion DCT and the first welding contact hole WH1 of the welding contact portion WCT are formed, the inclined surface between the driving contact portion DCT and the welding contact portion WCT can be formed to have a high inclination, so that a minimum distance between the half-tone mask for forming the first inclined surface S1 of the first driving contact hole DH1 of the driving contact portion DCT and the half-tone mask for forming the third inclined surface S3 of the first welding contact hole WH1 of the welding contact portion WCT can be obtained. Therefore, the inclined surface can be formed in a desired shape between the first driving contact hole DH1 and the first welding contact hole WH1, and thus the anode electrode formed in each of the first driving contact hole DH1 and the first welding contact hole WH1 can be stably formed. Furthermore, since there is no need to increase the length of the area, in which the driving contact portion DCT and the welding contact portion WCT are formed, in the first direction (e.g., X-axis direction), the driving contact portion DCT and the welding contact portion WCT can be disposed adjacent to each other in the first direction (e.g., X-axis direction) even in the light emitting display apparatus of high resolution.

Meanwhile, the first driving contact hole DH1 of the driving contact portion DCT and the first welding contact hole WH1 of the welding contact portion WCT can be formed such that an inclined surface formed between first driving contact hole DH1 or the first welding contact hole WH1 and the light emission area EA having the light extraction unit 140 has a low inclination. Therefore, in the light emitting display apparatus according to one embodiment of the present disclosure, the light extraction unit 140 disposed adjacent to the circuit area CA can be stably formed. That is, the light emitting display apparatus according to one embodiment of the present disclosure can prevent light extraction efficiency from being reduced as the shape of the light extraction unit 140 disposed adjacent to the circuit area CA is deformed.

In the light emitting display apparatus according to one embodiment of the present disclosure, the second anode electrode AE2 can be formed in the first welding contact hole WH1 of the welding contact portion WCT to cover the third inclined surface S3. Therefore, the light emitting display apparatus according to one embodiment of the present disclosure can prevent an etchant from being permeated between the third inclined surface S3 of the overcoat layer 130 and the passivation layer 118 when the second anode electrode AE2 is formed.

The overcoat layer 130 formed between the first driving contact hole DH1 of the driving contact portion DCT and the first welding contact hole WH1 of the welding contact portion WCT can be provided with an edge area of the first connection electrode CP1 therebelow as shown in FIG. 8. When the second anode electrode AE2 does not cover the third inclined surface S3 in the first welding contact hole WH1 of the welding contact portion WCT, the etchant can be easily permeated into the passivation layer 118 when the second anode electrode AE2 is formed. In this situation, when a seam is present in the passivation layer 118, the etchant can be permeated into the first connection electrode CP1 through the seam of the passivation layer 118 so that the first connection electrode CP1 can be damaged.

In the light emitting display apparatus according to one embodiment of the present disclosure, the third inclined surface S3 of the overcoat layer 130 has a high inclination in the first welding contact hole WH1 of the welding contact portion WCT and the second anode electrode AE2 is formed to cover the third inclined surface S3 of the overcoat layer 130, so that the etchant can effectively be prevented from being permeated between the third inclined surface S3 of the overcoat layer 130 and the passivation layer 118. Furthermore, in the light emitting display apparatus according to one embodiment of the present disclosure, even though the seam is present in the passivation layer 118, the etchant can be prevented from being permeated into the first connection electrode CP1 through the seam of the passivation layer 118. As a result, the first connection electrode CP1 can be prevented from being damaged.

Also, in the light emitting display apparatus according to one embodiment of the present disclosure, the first connection electrode CP1 can be formed to not overlap with the third inclined surface S3 of the overcoat layer 130. Therefore, in the light emitting display apparatus according to one embodiment of the present disclosure, occurrence of the seam in the passivation layer 118 can be minimized.

A size of the first connection electrode CP1 provided below the overcoat layer 130 formed between the first driving contact hole DH1 of the driving contact portion DCT and the first welding contact hole WH1 of the welding contact portion WCT is reduced, so that a step difference of the passivation layer 118 in a boundary area between the third inclined surface S3 of the overcoat layer 130 and the passivation layer 118 can be reduced. Therefore, the possibility of occurrence of a seam in the boundary area between the passivation layer 118 and the third inclined surface S3 of the overcoat layer 130 can be reduced. Even though the seam occurs in the passivation layer 118, the etchant may not be easily permeated into the first connection electrode CP1 due to a long distance between the first connection electrode CP1 and the seam of the passivation layer 118.

Also, in the light emitting display apparatus according to one embodiment of the present disclosure, since the first connection electrode CP1 is located at a sufficient distance away from the third inclined surface S3 of the overcoat layer 130, even though an error occurs when the first driving contact hole DH1 of the driving contact portion DCT and the first welding contact hole WH1 of the welding contact portion WCT are formed, a proper spaced distance from the boundary area between the third inclined surface S3 of the overcoat layer 130 and the passivation layer 118 can be obtained. Therefore, the light emitting display apparatus according to one embodiment of the present disclosure can minimize damage to the first connection electrode CP1 due to the etchant.

Also, in the light emitting display apparatus according to one embodiment of the present disclosure, the second contact hole CH2 electrically connecting the second connection electrode CP2 with the first connection electrode CP1 with the welding contact portion WCT interposed therebetween and the first contact hole CH1 electrically connecting the first connection electrode CP1 with the driving transistor DTR can be disposed. Therefore, the light emitting display apparatus according to one embodiment of the present disclosure can minimize the size of the circuit area CA and can greatly increase the size of the light emission area EA in a structure in which the driving contact portion DCT and the welding contact portion WCT are disposed in the first direction (e.g., X-axis direction).

Meanwhile, the light emitting display apparatus according to one embodiment of the present disclosure can have a light extraction structure in which a rainbow pattern (or rainbow stain pattern) and a circular ring pattern of a radiation shape, which appear when external light is reflected in the light extraction unit 140, can be minimized. Hereinafter, the light extraction structure for minimizing a rainbow pattern will be described with reference to FIGS. 12A to 12C.

FIG. 12A is a view illustrating a rotational structure of a light extraction unit per pixel according to an embodiment of the present disclosure, FIG. 12B is an enlarged view illustrating a light extraction unit configured in a pixel of a first row and a (j)th column according to an embodiment of the present disclosure, which is shown in FIG. 12A, and FIG. 12C is an enlarged view illustrating a light extraction unit configured in a pixel of an (i)th row and a (j)th column according to an embodiment of the present disclosure, which is shown in FIG. 12A.

In the light emitting display apparatus, when external light is incident on the light extraction unit 140 in a non-driven or off state, reflective light can be generated by the convex portion 143 of the light extraction unit 140, and can be emitted to the outside through the light emitting surface in accordance with a birefringent effect of a thin film. The reflective light can generate a rainbow pattern (or a rainbow stain pattern) which is spread in a radial shape while having a rainbow color due to dispersion characteristics of light according to a difference in refractive angles for each wavelength due to material characteristics of the light emitting element 150 and a refractive index difference for each layer. For example, the reflective light can generate a radial-shaped rainbow pattern and a radial-shaped circular ring pattern in accordance with destructive interference and/or constructive interference of light, thereby reducing black visibility characteristics.

In the light emitting display apparatus according to one embodiment of the present disclosure, the light extraction unit 140 can be configured to rotate (or horizontally rotate, or be slightly offset) at a preset angle based on a random reference point in order to reduce or minimize occurrence of a radial-shaped rainbow pattern and a radial-shaped circular ring pattern due to destructive interference and/or constructive interference of the reflective light in each of the plurality of pixels P. For example, the light extraction unit 140 disposed in one or more of the plurality of pixels P can be configured by being rotated at a rotational angle θ3 greater than 0° and smaller than 60° based on a random reference point in a corresponding pixel area in a unit of one pixel P. In this situation, the rotational angle θ3 can be an angle between a first tilt line TL1 and a first straight line SL1 of the concave portions 141 or an angle between a second tilt line TL2 and a second straight line SL2 of the concave portions 141. For example, the rotational angle of the light extraction unit 140 disposed in each of the plurality of pixels P can be set irregularly or randomly along one or more of the first direction (e.g., X-axis direction), the second direction (e.g., Y-axis direction) and a diagonal direction within the range of the rotational angle θ3 greater than 0° and smaller than 60°. For example, the random reference point can be a random position within the light emission area EA of each of the first to fourth subpixels SP1 to SP4 of the pixel P, or can be a central portion C of any one of the plurality of concave portions 141.

Referring to FIG. 12A, the light emitting display apparatus according to one embodiment of the present disclosure can include a plurality of pixel blocks PB. The display area DA can be divided or blocked into a plurality of pixel blocks PB. Each of the plurality of pixel blocks PB can include a plurality of pixel groups PG[1,1] to PG[i,j]. For example, each of the plurality of pixel blocks PB can include i×j number (or i number of rows and j number of columns) of pixel groups PG[1,1] to PG[i,j].

The plurality of pixels P disposed in the display area DA can be grouped into a plurality of pixel groups PG[1,1] to PG[i,j]. For example, each of the plurality of pixel groups PG[1,1] to PG[i,j] can be configured as one pixel P.

According to one embodiment of the present disclosure, one or more of the light extraction units 140 disposed in the respective pixels P of the plurality of pixel groups PG[1,1] to PG[i,j] can be configured by being rotated at a preset angle based on a random reference point in a corresponding pixel P. For example, in each of the plurality of pixel groups PG[1,1] to PG[i,j], the light extraction unit 140 disposed in each of the plurality of subpixels SP included in the pixel P can be configured to be rotated at a preset angle based on the central portion of any one concave portion 141 in the corresponding subpixel.

The rotational angles of the light extraction units 140 respectively disposed in the plurality of subpixels SP included in the pixel P of each of the plurality of pixel groups PG[1,1] to PG[i,j] can be the same as each other. For example, the rotational angles of the light extraction units 140 respectively disposed in the plurality of subpixels SP constituting one pixel P can be the same as each other. The rotational angles of the light extraction units 140 respectively disposed in the plurality of subpixels SP constituting one pixel P can be a rotational angle for each pixel. For example, the rotational angle for each pixel of the light extraction unit 140 can refer to a rotational angle of the light extraction unit 140 equally set in each of the plurality of subpixels SP constituting one pixel P.

For example, the rotational angles for each pixel of the light extraction units 140 disposed in adjacent pixel groups among the pixel groups PG[1,1] to PG[i,j] can be different from each other. For example, the rotational angles for each pixel of the light extraction units 140 respectively disposed in the pixel groups PG[1,1] to PG[i,j] can be different from each other in 1° or 3° or more. For example, the rotational angles for each pixel of the light extraction units 140 disposed in one or more non-adjacent pixel groups among the pixel groups PG[1,1] to PG[i,j] can be 0° or the same as each other, and the rotational angles for each pixel of the light extraction units 140 disposed in the other pixels can be set irregularly or randomly within the range of 0° to 60°. For example, when the rotational angles for each pixel between adjacent light extraction units 140 have a difference of 3° or more, occurrence of a radial-shaped circular ring pattern together with a radiation-shaped rainbow pattern can be effectively suppressed or minimized.

According to one embodiment of the present disclosure, in each of the plurality of pixel blocks PB, the rotational angles for each pixel block of the light extraction units 140 respectively disposed in the i×j number of pixel groups PG[1,1] to PG[i,j] can be set differently or randomly in a unit of pixel block. For example, the rotational angles for each pixel block of the light extraction units 140 disposed in pixel blocks, which are directly adjacent to each other along any one of the first direction, the second direction and the diagonal direction, among the plurality of pixel blocks PB can have asymmetry, non-regularity or randomness. For example, the rotational angles for each pixel block of the light extraction units 140 disposed in pixel blocks, which are directly adjacent to each other along one of the first direction, the second direction and the diagonal direction, among the plurality of pixel blocks PB can be different from each other as a whole. For example, some of the rotational angles for each pixel block of the light extraction unit 140 disposed in pixel blocks, which are not directly adjacent to each other along one of the first direction, the second direction and the diagonal direction, among the plurality of pixel blocks PB can be 0° or the same as each other.

For example, as shown in FIGS. 12B and 12C, the rotational angle θ3 of the light extraction unit 140 disposed in the pixel group PG[1,j] of 1×j (or first row and (j)th column) can be different from the rotational angle θ3 of the light extraction unit 140 disposed in the pixel group PG[2,j] of 2×j (or second row and (j)th column). For example, the rotational angle θ3 of the light extraction unit 140 disposed in the pixel group PG[1,j] of 1×j (or first row and (j)th column) can have a difference of 1° or 3° or more with the rotational angle θ3 of the light extraction unit 140 disposed in the pixel group PG[2,j] of 2×j (or second row and (j)th column). For example, the rotational angle θ3 of the light extraction unit 140 disposed in the pixel group PG[1,j] of 1×j (or first row and (j)th column) shown in FIG. 12B can be 5°. The rotational angle θ3 of the light extraction unit 140 disposed in the pixel group PG[2,j] of 2×j (or second row and (j)th column) shown in FIG. 12C can be 15°.

Therefore, in the light emitting display apparatus according to one embodiment of the present disclosure, the rotational angles for each pixel block of the light extraction units 140 respectively disposed in the plurality of pixel blocks PB can be set differently or randomly. Also, in the light emitting display apparatus according to one embodiment of the present disclosure, the rotational angles for each pixel of the light extraction units 140 respectively disposed in the plurality of pixel groups PG[1,1] to PG[i,j] included in each of the plurality of pixel blocks PB can be set differently or randomly. Furthermore, in the light emitting display apparatus according to one embodiment of the present disclosure, the rotational angles for each subpixel of the light extraction units 140 respectively disposed in the plurality of subpixels included in each of the plurality of pixel groups PG[1,1] to PG[i,j] can be set differently or randomly.

Therefore, in the light emitting display apparatus according to one embodiment of the present disclosure, a diffraction pattern of reflective light generated by reflection in the light extraction units 140 respectively disposed in the plurality of pixels P is changed in a unit of pixel. Therefore, the diffraction pattern of reflective light generated by the light extraction unit 140 of each of the plurality of pixels P can be offset or minimized, or occurrence of a radial-shaped rainbow pattern and a radial circular ring pattern of the reflective light can be suppressed or minimized due to non-regularity or randomness of the diffraction pattern of the reflective light. In the light emitting display apparatus according to one embodiment of the present disclosure, degradation of black visibility characteristics caused by reflection of external light in a non-driving or off state can be reduced, whereby real black can be realized.

The light emitting display apparatus according to the present disclosure can be applied to all of electronic devices. For example, the light emitting display apparatus according to the present disclosure can be applied to a mobile device, a video phone, a smart watch, a watch phone, a wearable device, a foldable device, a rollable device, a bendable device, a flexible device, a curved device, an electronic diary, an electronic book, a portable multimedia player (PMP), a personal digital assistant (PDA), an MP3 player, a mobile medical device, a desktop PC, a laptop PC, a netbook computer, a workstation, a navigator, a vehicle navigator, a vehicle display device, a television, a wall paper display device, a signage device, a game device, a laptop computer, a monitor, a camera, a camcorder, home appliances, etc.

According to the present disclosure, the following advantageous effects can be obtained.

The present disclosure can improve light extraction efficiency of light emitted from the light emitting element layer and thus can have high light emission efficiency even with low power. Therefore, the present disclosure can reduce power consumption.

In the present disclosure, the driving contact portion and the welding contact portion can be disposed adjacent to each other in a direction parallel with a direction in which subpixels provided in one pixel are arranged. Therefore, the size of the circuit area can be reduced, and as a result, the size of the light emission area can be increased and the occurrence of a dead subpixel can be avoided or repaired.

Also, in the present disclosure, when the driving contact hole and the welding contact hole are formed, the inclined surface formed between the driving contact portion and the welding contact portion can be formed to have a high inclination, whereby the minimum interval between the half-tone mask for forming the inclined surface of the driving contact hole and the half-tone mask for forming the inclined surface of the welding contact hole can be obtained. Therefore, the inclined surface can be formed in a desired shape between the driving contact hole and the welding contact hole, and the anode electrode formed in each of the driving contact hole and the welding contact hole can be stably formed.

Also, since there is no need to increase the horizontal length of the area in which the driving contact portion and the welding contact portion are formed, the driving contact portion and the welding contact portion can be disposed adjacent to each other in the horizontal direction even in the light emitting display apparatus of high resolution.

Also, in the present disclosure, when the driving contact hole and the welding contact hole are formed, the inclined surface formed between the driving contact hole or the welding contact hole and the light emission area provided with the light extraction unit can be formed to have a low inclination, whereby the light extraction unit disposed adjacent to the circuit area can be stably formed. Therefore, in the present disclosure, light extraction efficiency can be prevented from being reduced as the shape of the light extraction unit disposed adjacent to the circuit area is deformed.

Also, in the present disclosure, the anode electrode can be formed to cover the inclined surface of the overcoat layer in the welding contact hole, so that the etchant can be prevented from being permeated between the inclined surface of the overcoat layer and the passivation layer when the anode electrode is formed. Therefore, even though the seam is present in the passivation layer, the etchant is not permeated into the first connection electrode through the seam of the passivation layer, and as a result, the first connection electrode can be prevented from being damaged.

Also, in the present disclosure, the first connection electrode is formed so as not to overlap the inclined surface of the overcoat layer formed in the welding contact hole, occurrence of the seam in the passivation layer in the boundary area between the inclined surface of the overcoat layer and the passivation layer can be minimized. Also, even though the seam occurs in the passivation layer, the etchant is not easily permeated into the first connection electrode due to the long distance between the first connection electrode and the seam of the passivation layer, whereby damage to the first connection electrode due to the etchant can be minimized.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims, and it is intended that all variations or modifications derived from the meaning, scope and equivalent concept of the claims fall within the scope of the present disclosure.

What is claimed is:

1. A light emitting display apparatus comprising:
a first anode electrode in a first pixel;
a second anode electrode in a second pixel disposed adjacent to the first pixel;
a driving transistor configured to supply power to the first pixel;
a first connection electrode electrically connected to the driving transistor;
a second connection electrode disposed on a different layer than the first connection electrode, the second connection electrode being electrically connected to the driving transistor; and
an organic insulating layer disposed over the first connection electrode and the second connection electrode, the organic insulating layer including a first driving contact hole overlapping with at least a portion of the first connection electrode and a first welding contact hole overlapping with at least a portion of the second connection electrode,
wherein the first anode electrode overlaps with the first driving contact hole, and the second anode electrode overlaps with the first welding contact hole, and
wherein the first driving contact hole and the first welding contact hole are disposed adjacent to each other on a first line.

2. The light emitting display apparatus of claim 1, wherein the first pixel includes a plurality of subpixels arranged on a second line parallel with the first line.

3. The light emitting display apparatus of claim 1, further comprising an inorganic insulating layer disposed between the organic insulating layer and the first connection electrode,
wherein the inorganic insulating layer includes:
a second driving contact hole overlapping with the first driving contact hole; and
a second welding contact hole overlapping with the first welding contact hole,
wherein the first anode electrode is disposed in the first driving contact hole and the second driving contact hole, and the first anode electrode is electrically connected to the first connection electrode in contact with the first connection electrode in the second driving contact hole, and
wherein the second anode electrode is disposed in the first welding contact hole and the second welding contact hole, and the second anode electrode is spaced apart from the second connection electrode by a buffer layer disposed between the second anode electrode and the second connection electrode, the second anode electrode being electrically separated from the second connection electrode.

4. The light emitting display apparatus of claim 3, wherein the second welding contact hole corresponds to a welding point configured to electrically connect the second anode electrode with the second connection electrode by irradiating a laser at the welding point.

5. The light emitting display apparatus of claim 3, wherein the first driving contact hole exposes the second driving contact hole and a portion of an upper surface of the inorganic insulating layer, and wherein the first welding contact hole exposes the second welding contact hole and a portion of an upper surface of the inorganic insulating layer.

6. The light emitting display apparatus of claim 1, wherein the first driving contact hole includes a first inclined surface on a side facing the first welding contact hole and a second inclined surface on a side facing the first anode electrode,
wherein the first welding contact hole includes a third inclined surface on a side facing the first driving contact hole and a fourth inclined surface on a side facing the first anode electrode, and
wherein the first inclined surface and the second inclined surface have different angles of inclination, and the third inclined surface and the fourth inclined surface have different angles of inclination.

7. The light emitting display apparatus of claim 6, wherein an inclination angle of the first inclined surface is greater than an inclination angle of the second inclined surface, and
wherein an inclination angle of the third inclined surface is greater than an inclination angle of the fourth inclined surface.

8. The light emitting display apparatus of claim 6, wherein the second anode electrode overlaps with the first welding contact hole, and the second anode electrode covers the third inclined surface in the first welding contact hole.

9. The light emitting display apparatus of claim 6, wherein a width of the first connection electrode is greater than a width of the first driving contact hole,
wherein the first connection electrode overlaps with the first driving contact hole and is disposed between the first driving contact hole and the first welding contact hole without overlapping with the third inclined surface of the first welding contact hole.

10. The light emitting display apparatus of claim 1, wherein the second connection electrode is disposed below the first connection electrode.

11. The light emitting display apparatus of claim 1, wherein the first connection electrode includes:
a first electrode pattern overlapping with the first driving contact hole;
a second electrode pattern protruding from the first electrode pattern, the second electrode pattern being disposed between the first welding contact hole and the first anode electrode; and
a third electrode pattern protruding from the first electrode pattern, the third electrode pattern being disposed between the first welding contact hole and the second pixel.

12. The light emitting display apparatus of claim 11, wherein the first electrode pattern of the first connection electrode is electrically connected to the first anode electrode through the first driving contact hole, and
wherein the second electrode pattern of the first connection electrode is electrically connected to the driving transistor through a first contact hole.

13. The light emitting display apparatus of claim 12, wherein the third electrode pattern of the first connection electrode is electrically connected to the second connection electrode through a second contact hole.

14. The light emitting display apparatus of claim 13, wherein the first welding contact hole is disposed between the first contact hole and the second contact hole.

15. The light emitting display apparatus of claim 1, further comprising:
a first group of subpixels disposed in the first pixel; and
a second group of subpixels disposed in the second pixel,

wherein one or more of subpixels among the first and second groups of subpixels includes a light extraction part having a plurality of concave portions and a convex portion between the plurality of concave portions.

16. A light emitting display apparatus comprising:
a subpixel disposed on a substrate, the subpixel including a light emission area and a circuit area;
a light emitting element disposed in the light emission area, the light emitting element including an anode electrode, a light emitting layer and a cathode electrode;
a driving transistor disposed in the circuit area;
a driving contact portion disposed in the circuit area, the driving contact portion electrically connecting the anode electrode of the light emitting element with the driving transistor; and
a welding contact portion disposed in the circuit area, the welding contact portion electrically connecting an anode electrode of an adjacent light emitting element in an adjacent subpixel with the driving transistor, the adjacent subpixel being disposed adjacent to the subpixel,
wherein the driving contact portion and the welding contact portion are disposed adjacent to each other in a first direction.

17. The light emitting display apparatus of claim 16, wherein the subpixel and the adjacent subpixel are disposed adjacent to each other in a second direction crossing the first direction.

18. The light emitting display apparatus of claim 16, wherein the subpixel and the adjacent subpixel are configured to emit light of a same color.

19. The light emitting display apparatus of claim 16, wherein the driving contact portion includes:
a first connection electrode electrically connected to the driving transistor; and
at least one insulating layer disposed over the first connection electrode, the at least one insulating layer including a driving contact hole exposing at least a portion of the first connection electrode, and
wherein the anode electrode of the subpixel includes a first light emitting portion in the light emission area of the subpixel, and a first connection portion extending from the first light emitting portion and overlapping with the driving contact hole.

20. The light emitting display apparatus of claim 19, wherein the first connection portion is disposed in the driving contact hole, contacts the first connection electrode in the driving contact hole and is electrically connected to the first connection electrode.

21. The light emitting display apparatus of claim 19, wherein the driving contact hole includes a first inclined surface on a side facing the welding contact portion and a second inclined surface on a side facing the light emission area of the subpixel, and
wherein the first inclined surface and the second inclined surface have different angles of inclination.

22. The light emitting display apparatus of claim 21, wherein the first inclined surface has an inclination angle greater than an inclination angle of the second inclined surface.

23. The light emitting display apparatus of claim 16, wherein the welding contact portion includes:
a second connection electrode electrically connected to the driving transistor; and
at least one insulating layer disposed over the second connection electrode, the at least one insulating layer including a welding contact hole overlapping with at least a portion of the second connection electrode, and
wherein the anode electrode of the adjacent subpixel includes a second light emitting portion and a second connection portion extending from the second light emitting portion and overlapping the welding contact hole.

24. The light emitting display apparatus of claim 23, wherein the second connection portion is disposed in the welding contact hole, and the second connection portion is electrically separated from the second connection electrode by a buffer layer, and
wherein the welding contact hole is configured to connect the connection potion with the second connection electrode when irradiated with a laser.

25. The light emitting display apparatus of claim 23, wherein the welding contact hole includes a third inclined surface on a side facing the driving contact portion and a fourth inclined surface on a side facing the light emission area of the subpixel, and
wherein the third inclined surface and the fourth inclined surface have different angles of inclination.

26. The light emitting display apparatus of claim 25, wherein the third inclined surface has an inclination angle greater than an inclination angle of the fourth inclined surface.

27. The light emitting display apparatus of claim 25, wherein the second connection portion covers the third inclined surface in the welding contact hole.

28. A light emitting display apparatus comprising:
a first subpixel disposed in a first row;
a second subpixel disposed in a second row adjacent to the first row;
a driving transistor disposed in a circuit area between the first subpixel and the second subpixel, the driving transistor being electrically connected to the first subpixel;
a welding contact portion disposed in the circuit area between the first subpixel and the second subpixel,
wherein the welding contact portion is configured to electrically connect the second subpixel with the driving transistor in response to being irradiated with a laser.

29. The light emitting display apparatus of claim 28, further comprising:
a driving contact portion disposed in the circuit area between the first subpixel and the second subpixel, the driving contact portion electrically connecting a first anode of the first subpixel with the driving transistor,
wherein the welding contact portion is disposed over a portion of a second anode of the second subpixel.

30. The light emitting display apparatus of claim 29, wherein the driving contact portion and the welding contact portion are disposed along a same line in the circuit area between the first subpixel and the second subpixel.

* * * * *